(12) United States Patent
Lee et al.

(10) Patent No.: US 11,631,448 B1
(45) Date of Patent: Apr. 18, 2023

(54) MEMORY DEVICE PERFORMING REFRESH OPERATION AND METHOD OF OPERATING THE SAME

(71) Applicant: SAMSUNG ELECTRONICS CO., LTD., Suwon-si (KR)

(72) Inventors: Eunae Lee, Hwaseong-si (KR); Sunghye Cho, Hwaseong-si (KR); Kijun Lee, Seoul (KR); Junjin Kong, Yongin-si (KR); Yeonggeol Song, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/244,466

(22) Filed: Apr. 29, 2021

(51) Int. Cl.
 *G11C 11/406* (2006.01)
 *G06F 12/06* (2006.01)
(52) U.S. Cl.
 CPC ........ *G11C 11/40611* (2013.01); *G06F 12/06* (2013.01); *G06F 2212/70* (2013.01)
(58) Field of Classification Search
 None
 See application file for complete search history.

(56) References Cited

U.S. PATENT DOCUMENTS

| | | | |
|---|---|---|---|
| 9,032,141 B2 | 5/2015 | Bains et al. | |
| 9,384,821 B2 | 7/2016 | Bains et al. | |
| 9,721,643 B2 | 8/2017 | Bains et al. | |
| 9,805,783 B2 | 10/2017 | Ito et al. | |
| 9,978,440 B2 * | 5/2018 | Cho | G11C 11/408 |
| 10,083,737 B2 | 9/2018 | Bains et al. | |
| 10,170,174 B1 | 1/2019 | Ito et al. | |
| 10,446,216 B2 * | 10/2019 | Oh | G11C 11/4076 |
| 10,453,503 B2 | 10/2019 | Kilmer et al. | |
| 10,475,503 B2 | 11/2019 | Yoo et al. | |
| 10,573,370 B2 | 2/2020 | Ito et al. | |
| 2013/0279283 A1 * | 10/2013 | Seo | G11C 7/00 365/222 |

FOREIGN PATENT DOCUMENTS

EP  2926344  7/2015

* cited by examiner

*Primary Examiner* — Charles J Choi
(74) *Attorney, Agent, or Firm* — F. Chau & Associates, LLC

(57) ABSTRACT

A memory device includes a memory cell array, an address manager and a refresh controller. The memory cell array includes a plurality of memory cells coupled to a plurality of word-lines. The address manager samples access addresses provided from a memory controller to generate sampling addresses and determines a capture address from among the access addresses, based on a time interval between refresh commands from the memory controller. The refresh controller refreshes target memory cells from among the plurality of memory cells based on one of a maximum access address from among the sampling address and the captured address.

20 Claims, 18 Drawing Sheets

FIG. 5
| REGISTER | ADDRESS | COUNT |
|---|---|---|
| SAMPLING REGISTER 1 | ADD2 | 4 |
| SAMPLING REGISTER 2 | ADD3 | 1 |
| SAMPLING REGISTER 3 | ADD1 | 2 |
| SAMPLING REGISTER 4 | ADD4 | 1 |
| CAPTURE REGISTER | ADD5 | - |
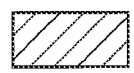 :MAX ACCESS ADDRESS
 :CAPTURE ADDRESS

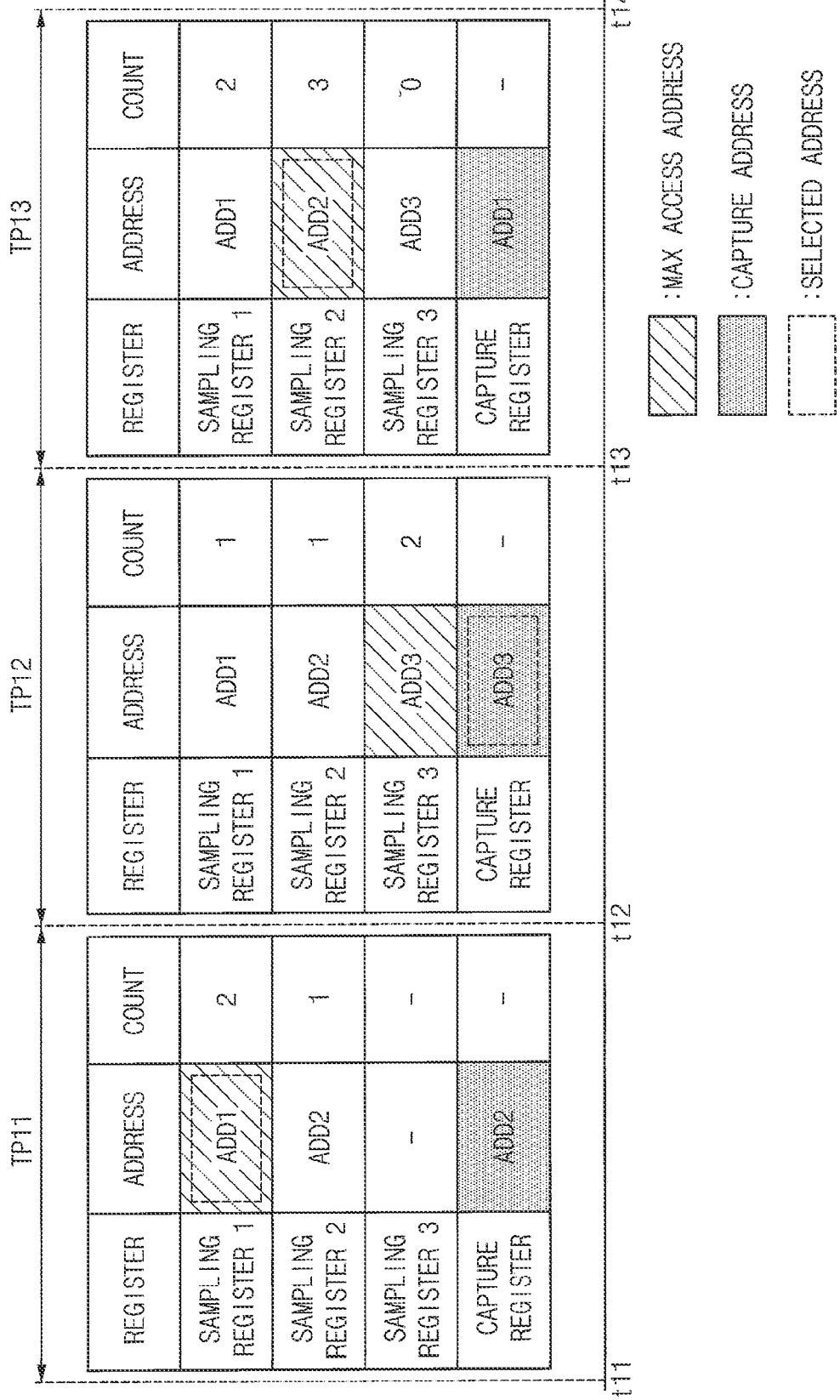

FIG. 13

| COMPARATOR RESULTS | SELECTED ADDRESS (SADD) |
|---|---|
| MADD = PADD<br>CADD ≠ PADD | CADD |
| MADD ≠ PADD<br>CADD = PADD | MADD |
| MADD ≠ PADD<br>CADD ≠ PADD | MADD or CADD |
| MADD = PADD<br>CADD = PADD | − |

MEMORY DEVICE PERFORMING REFRESH OPERATION AND METHOD OF OPERATING THE SAME

TECHNICAL FIELD

Example embodiments of the present disclosure relate to memory devices, and more particularly, to memory devices performing refresh operation and methods of operating the same.

DISCUSSION OF RELATED ART

A dynamic random access memory (DRAM) device may store data by storing a charge to a capacitor of a memory cell connected to a given word-line. The DRAM device may periodically refresh the memory cell since charges in the capacitor leak over time.

The influence of charges of an adjacent memory cell connected to another word-line adjacent to the given word-line increases as processes for manufacturing memory devices are scaled down and periods between word-lines become narrower. When the given word-line (e.g., the active state word-line) is intensively accessed, a row hammer may occur in an adjacent memory cell. That is, due to a voltage of the active state word-line, data stored in the memory cells connected to other word-lines adjacent to the active state word-line may be lost or changed to an unintended state.

SUMMARY

At least one exemplary embodiment of the inventive concept provides a memory device capable of preventing data from being damaged due to a specified word-line being intensively accessed.

At least one exemplary embodiment of the inventive concept provides a method of operating a memory device, capable of preventing data from being damaged due to a specified word-line being intensively accessed.

According to an exemplary embodiment of the inventive concept, a memory device includes a memory cell array, an address manager and a refresh controller. The memory cell array includes a plurality of memory cells coupled to a plurality of word-lines. The address manager performs a sampling on access addresses provided from a memory controller to generate sampling addresses and determines a capture address from among the access addresses, based on a time interval between refresh commands from the memory controller. The refresh controller refreshes target memory cells from among the plurality of memory cells based on one of a maximum access address from among the sampling address and the captured address.

According to an exemplary embodiment of the inventive concept, a memory device includes a memory cell array, an address manager and a refresh controller. The memory cell array includes a plurality of memory cells coupled to a plurality of word-lines. The address manager samples access addresses provided from a memory controller to generate sampling addresses and determines a capture address from among the access addresses. The refresh controller determines a selected address from a maximum address from among the sampling addresses and the captured address based on a previous selected address determined based on a previous refresh command, and refreshes target memory cells from among the plurality of memory cells based on the selected address, in response to a refresh command from the memory controller.

According to an exemplary embodiment of the inventive concept, a method of operating a memory device including a plurality of memory cells coupled to a plurality of word-lines is provided. The method includes sampling access provided from a memory controller to generate sampling addresses and determining a capture address from among the access addresses; receiving a refresh command from the memory controller; and refreshing target memory cells from among the plurality of memory cells based on one of a maximum access address from among the sampling address and the captured address in response to the refresh command.

According to an exemplary embodiment of the inventive concept, a method of operating a memory device including a plurality of memory cells coupled to a plurality of word-lines is provided. The method includes refreshing first memory cells in response to a first refresh command from a memory controller, based on a first maximum access address from among first sampling addresses sampled before receiving the first refresh command; in response to a second refresh command from the memory controller, refreshing second memory cells based on a second maximum access address from among second sampling addresses sampled before receiving the second refresh command when a captured address matches the first maximum access address; and refreshing third memory cells refreshed based on the captured address when the captured address is different from the first maximum access address.

A memory device according to at least one exemplary embodiment of the inventive concept selects an address for a refresh operation by sampling and capturing a portion of addresses accessed by a memory controller and performs the refresh operation based on the selected address. Accordingly, the memory device may prevent data of memory cells connected to at least one word-line adjacent to a target word-line from being damaged when a target word-line is intensively accessed.

BRIEF DESCRIPTION OF THE DRAWINGS

The present disclosure will become more apparent by describing in detail example embodiments thereof with reference to the accompanying drawings.

FIG. 5 is an example in which the memory device in FIG. 1 manages the sampling addresses and the captured address.

FIG. 9 is a timing diagram illustrating an example in which the memory device in FIG. 7 selects an address for refresh operation based on an example in FIG. 8A.

FIG. 13 illustrates an example in which the address selector in FIG. 12 outputs a selected address.

DETAILED DESCRIPTION OF THE EMBODIMENTS

Figure 1:
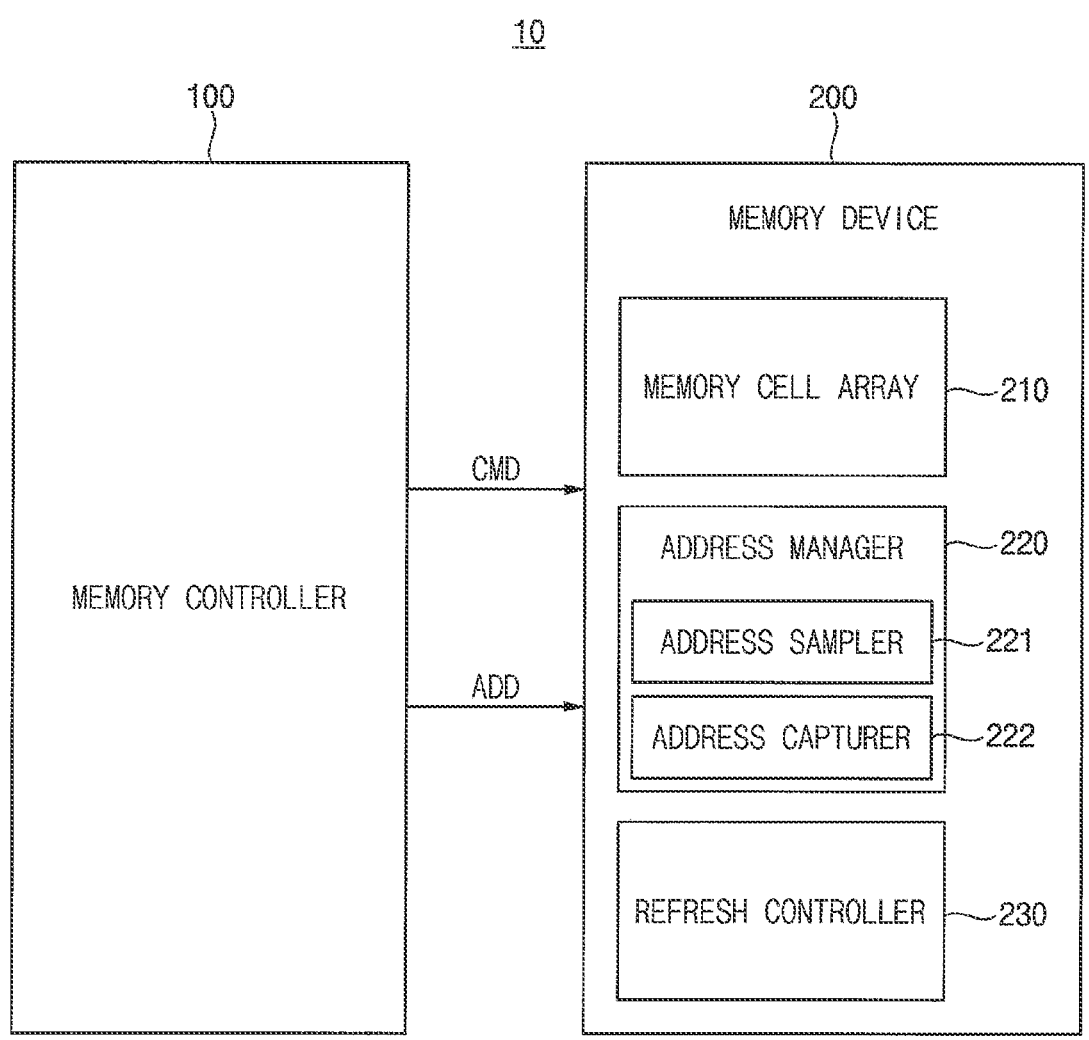
FIG. 1 is a block diagram illustrating a memory system according to an exemplary embodiment of the inventive concept.

Exemplary embodiments of the present disclosure will be described more fully hereinafter with reference to the accompanying drawings. Like reference numerals may refer to like elements throughout the accompanying drawings.

FIG. 1 is a block diagram illustrating a memory system according to an exemplary embodiment of the inventive concept.

Referring to FIG. 1, a memory system 10 includes a memory controller 100 and a memory device 200.

For example, the memory system 10 may be included or implemented in one of various electronic devices such as a desktop computer, a laptop computer, a workstation, a server, a mobile device, etc.

The memory controller 100 may control the overall operation of the memory device 200. The memory controller 100 may control the overall data exchange between an external host and the memory device 200. For example, the memory controller 100 may write data to the memory device 200 or read data from the memory device 200 in response to a request from the host.

In addition, the memory controller 100 may transmit a command CMD and an address ADD to the memory device 200 for controlling the memory device 200. The memory controller 100 may transmit the command CMD and the address ADD to the memory device 200 through one channel (the same signal line) or different channels (different signal lines).

The memory controller 100 may be implemented in a host (not illustrated) and may access the memory device 200 according to a request from a processor (not illustrated) in the host. For example, the memory controller 100 may access the memory device 200 in a direct memory access (DMA) manner. The memory controller 100 may be implemented with a portion of a system-on chip (SoC), but is not limited thereto.

The memory device 200 may operate as a buffer memory, a working memory, or a main memory of the host which includes the memory controller 100. The memory device 200 may operate based on the command CMD and the address ADD transmitted by the memory controller 100. For example, the memory device 200 may store data transmitted from the memory controller 100 or may transmit data to the memory controller 100.

The memory device 200 includes a memory cell array 210, an address manager 220 (e.g., a manager circuit) and a refresh controller 230 (e.g., a control circuit).

The memory cell array 210 may include a plurality of memory cells coupled to a plurality of word-lines and a plurality of bit-lines. For example, each of the plurality of memory cells may be a DRAM cell. In this example, the memory controller 100 and the memory device 200 may communicate signals to each other based on a protocol such as double data rate (DDR), low power double data rate (LPDDR), graphics double data rate (GDDR), Wide I/O, high bandwidth memory (HBM) and hybrid memory cube (HMC), but embodiments of the inventive concept are not limited thereto. The memory cells may include memory cells of static random access memory (SRAM), a phase change random access memory (PRAM), a magnetic random access memory (MRAM), a ferroelectric random access memory (FRAM), a hybrid RAM, and a NAND flash memory.

The address manager 220 may manage an address ADD received from the memory controller 100.

For example, the address manger 220 may mange a portion of access addresses accessed by the memory controller 100. The address manager 200 may store a portion of addresses ADD received in response to an active command in a separate register. For example, the address ADD may correspond to a row address, but exemplary embodiments of the inventive concept are not limited thereto. In an exemplary embodiment, the refresh controller 230 refreshes memory cells based on addresses managed by the address manager 220.

In an embodiment, the address manager 220 includes an address sampler 221 (e.g., a sampling circuit) and an address capturer 222 (e.g., a capturing circuit).

In an exemplary embodiment, the address sampler 221 samples a portion of the access addresses before receiving a specified refresh command (i.e., a row hammer refresh command). The row hammer refresh command may correspond to one of a plurality of refresh commands received from the memory controller 100. A first row hammer refresh command may correspond to an N-th refresh command from among the plurality of refresh commands from the memory controller 100 and a second row hammer refresh command corresponds to a 2N-th refresh command from among the plurality of refresh commands from the memory controller 100. Here, N is an integer greater than one. The row hammer refresh command may correspond to a refresh command received at a periodical timing (e.g., received periodically). The address sampler 221 may store sampled addresses (sampling addresses) in a separate register.

The address capturer 222 may capture at least one of the access addresses before receiving the row hammer refresh command. The address capturer 222 may store the captured address in a separate register. The captured address may match one of the sampling addresses or may be different from the each of the sampling addresses.

In an embodiment, the address sampler 221 determines a maximum access address, which is accessed most frequently, from among the sampling addresses during a sampling period. For example, a sampling may have occurred during the sampling period to obtain the sampling addresses. The address sampler 221 may determine the maximum access address in response to the row hammer refresh command from the memory controller 100. In an embodiment, the address sampler 221 counts an access number of each of the sampling addresses and determines a sampling address whose access number is greatest (i.e., maximum) from among the sampling addresses as the maximum access address. For example, the address sampler 221 may determine the maximum access address based on a space saving algorithm. The address sampler 221 may store the maximum access address in a separate register or may provide the maximum access address to the refresh controller 230.

The refresh controller 230 may refresh a specified memory cell row in response to the row hammer refresh command from the memory controller 100.

In an exemplary embodiment, the refresh controller 230 generates a refresh address based on the maximum access address or the captured address. The refresh controller 230 may generate a refresh control signal for refreshing memory cells corresponding to the maximum access address or the captured address. For example, the refresh address may correspond to (designate) at least one (second) word-line adjacent to a (first) word-line corresponding to the maximum access address or the captured address. That is, memory cells coupled to at least one word-line adjacent to the word-line corresponding to the maximum access address or the captured address may be refreshed.

In an exemplary embodiment, a specified address (a target address) is frequently accessed or called by the memory controller 100, from among all addresses of the memory device 200. The number of times that the target address is accessed by the memory controller 100 may be relatively greater than the number of times that any other address of the memory device 200 is accessed by the memory controller 100. However, the above operation of the memory controller 100 may cause a disturbance or coupling with respect to data stored at a location adjacent to a location corresponding to the target address. For example, in a case where frequent, intensive, or iterative activation and deactivation is performed on a word-line corresponding to the target address by the memory controller 100, data of memory cells connected to at least one word-line adjacent to the word-line corresponding to the target address may be damaged.

The memory device 200 may refresh memory cells based on the maximum access address or the captured address for preventing the data from being damaged due to the target address being intensively accessed. In an embodiment, the memory device 200 performs a refresh operation (a row hammer refresh operation) based on the maximum access address and the captured address for preventing the data from being damaged due to a row hammer access. Therefore, the memory device 200 may prevent the data from being damaged even when addresses having various patterns are accessed.

Figure 2:
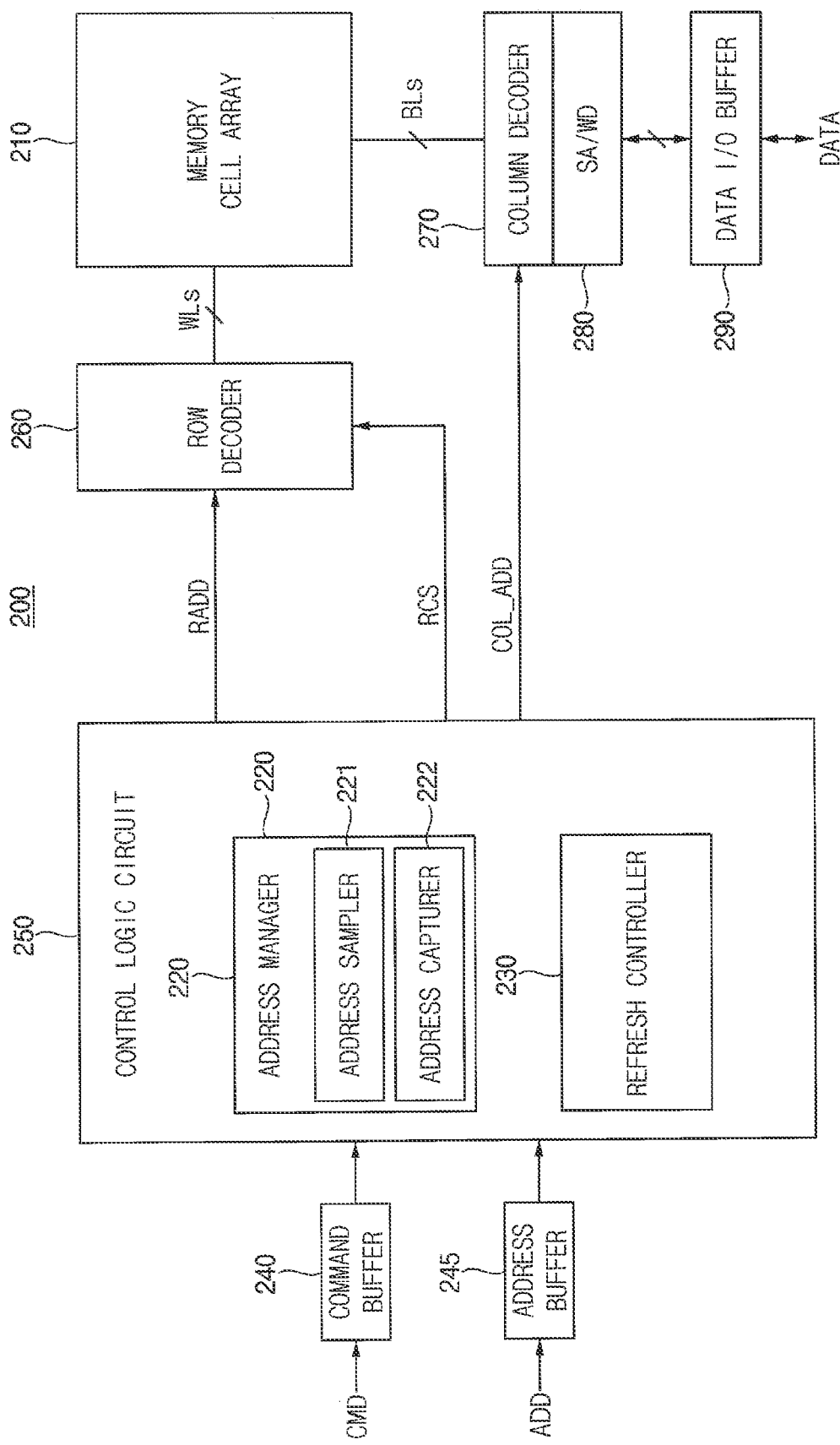
FIG. 2 is a block diagram illustrating an example of the memory device in FIG. 1 according to an exemplary embodiment of the inventive concept.

FIG. 2 is a block diagram illustrating an example of the memory device in FIG. 1 according to an exemplary embodiment of the inventive concept.

Referring to FIG. 2, the memory device 200 includes a memory cell array 210, a command buffer 240, an address buffer 245, a control logic circuit 250, a row decoder 260, a column decoder 270, a sense amplifier/write driver 280 and a data input/output (I/O) buffer 290.

The memory cell array 210 may include a plurality of memory cells which are respectively located at points where a plurality of word-lines WLs and a plurality of bit-lines BLs intersect each other.

The command buffer 240 may temporarily store the command CMD from the memory controller 100 and may transfer the command CMD to the control logic circuit 250. The address buffer 245 may temporarily store the address ADD from the memory controller 100 and may transfer the address ADD to the control logic circuit 250. In an exemplary embodiment, the address buffer 245 separates the address ADD into a row address and a column address and transfers the row address and the column address to the control logic circuit 250.

The control logic circuit 250 may receive the command CMD and the address ADD from the command buffer 240 and the address buffer 245, respectively. The control logic circuit 250 may decode the command CMD and may control components of the memory device 200 based on the decoded command. For example, the control logic circuit 250 may control the components of the memory device 200 to enable (or activate) a word-line corresponding to the address ADD in response to an active command. For example, the control logic circuit 240 may control the components of the memory device 200 to refresh memory cells in the memory cell array 210 in response to a refresh command.

The control logic circuit 250 may include the address manger 220 and the refresh controller 230.

The address manger 220 may sample and/or capture the addresses from the address buffer 245. For example, the address sampler 221 in the address manager 220 may sample a portion of the access addresses accessed by the memory controller 100 in response to receiving a row hammer refresh command and the address capturer 222 in the address manager 220 may capture at least one of the access addresses before receiving the row hammer refresh command. The address sampler 221 may determine the maximum access address from among the sampling addresses.

The refresh controller 230 may generate a refresh address RADD and a refresh control signal RCS associated with a row hammer refresh operation based on a row hammer refresh command from among refresh commands provided from the command buffer 240. The refresh controller 230 may generate the refresh address RADD and the refresh control signal RCS for refreshing memory cells based on the maximum access address or the captured address.

The refresh controller 230 may generate the refresh address RADD and the refresh control signal RCS such that the normal refresh operation is performed in response to the refresh command except the row hammer refresh command. For example, the refresh controller 230 may sequentially refresh memory cells in one of a plurality of memory banks in the memory device 200 through the normal refresh operation, which is referred to as a per-bank refresh operation, or may sequentially refresh memory cells in all of the plurality of memory banks in the memory device 200 through the normal refresh operation, which is referred to as an all-bank refresh operation.

Although not illustrated, the control logic circuit 250 may include a command decoder that decodes the command CMD and a mode register that sets an operation mode of the memory device 200. In addition, the control logic circuit 250 may further include an address separator that separates the address ADD into a row address and a column address.

The row decoder 260 may be coupled to the memory cell array 210 through the word-lines WLs. The row decoder 260 may control voltages of the word-lines WLs under control of the control logic circuit 250. For example, the row decoder 260 may refresh memory cells coupled to a word-line corresponding to the refresh address RADD by enabling and disabling the word-line corresponding to the refresh address RADD based on the refresh address RADD and the refresh control signal RCS.

The column decoder 270 may be coupled to the memory cell array 210 through the bit-lines BLs. The column decoder 270 may select one of the bit-lines BLs under control of the control logic circuit 250. For example, the column decoder 270 may select a bit-line corresponding to a column address COL_ADD from the control logic circuit 250.

The sense amplifier/write driver 280 may receive write data from the data I/O buffer 290 and may store the write data in memory cells selected by the row decoder 260 and the column decoder 270. The sense amplifier/write driver 280 may read data from the memory cells selected by the row decoder 260 and the column decoder 270 and may provide the read data to the data I/O buffer 290.

The data I/O buffer 290 may temporarily read data provided from the sense amplifier/write driver 280 and write data provided from an outside source. The data 110 buffer 290 may provide the read data to the memory controller 100 in FIG. 1, or may receive the write data to provide the write data to the sense amplifier/write driver 280.

Figure 3:
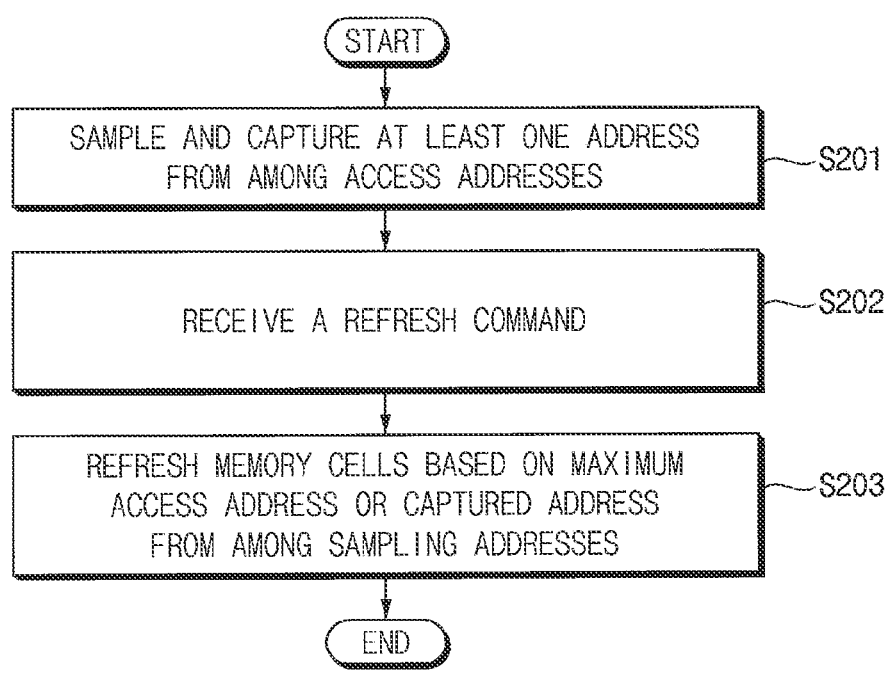
FIG. 3 is a flow chart illustrating a method of operating a memory device in FIG. 1 according to an exemplary embodiment of the inventive concept.

FIG. 3 is a flow chart illustrating a method of operating a memory device in FIG. 1 according to an exemplary embodiment of the inventive concept.

Referring to FIGS. 1 through 3, in operation S201, the memory device 200 samples at least one address from among a plurality of access addresses and captures at least one address from among a plurality of the access addresses. For example, the memory device 200 may sample first addresses from among the access addresses accessed by the memory controller 100 and may capture a second address from among the access addresses.

In operation S202, the memory device 200 receives a refresh command. The refresh command may correspond to one of a plurality of refresh commands received from the memory controller 100 and may correspond to a row hammer refresh command periodically received from the memory controller 100. In an exemplary embodiment, the refresh command is received before the sampling.

In operation S203, the memory device 200 refreshes memory cells based on a maximum access address from among the sampling addresses or the captured address. For example, if a first sampling address among the sampling addresses is accessed more frequently than the other sampling addresses, then the first sampling address would be the maximum access address.

For example, the memory device 200 may generate a refresh address based on the maximum access address or the captured address. For example, the refresh address may correspond to at least one word-line adjacent to a word-line corresponding to the maximum access address or the captured address. That is, memory cells coupled to at least one word-line adjacent to the word-line corresponding to the maximum access address or the captured address may be refreshed. Therefore, the row hammer refresh operation may be performed.

Figure 4:
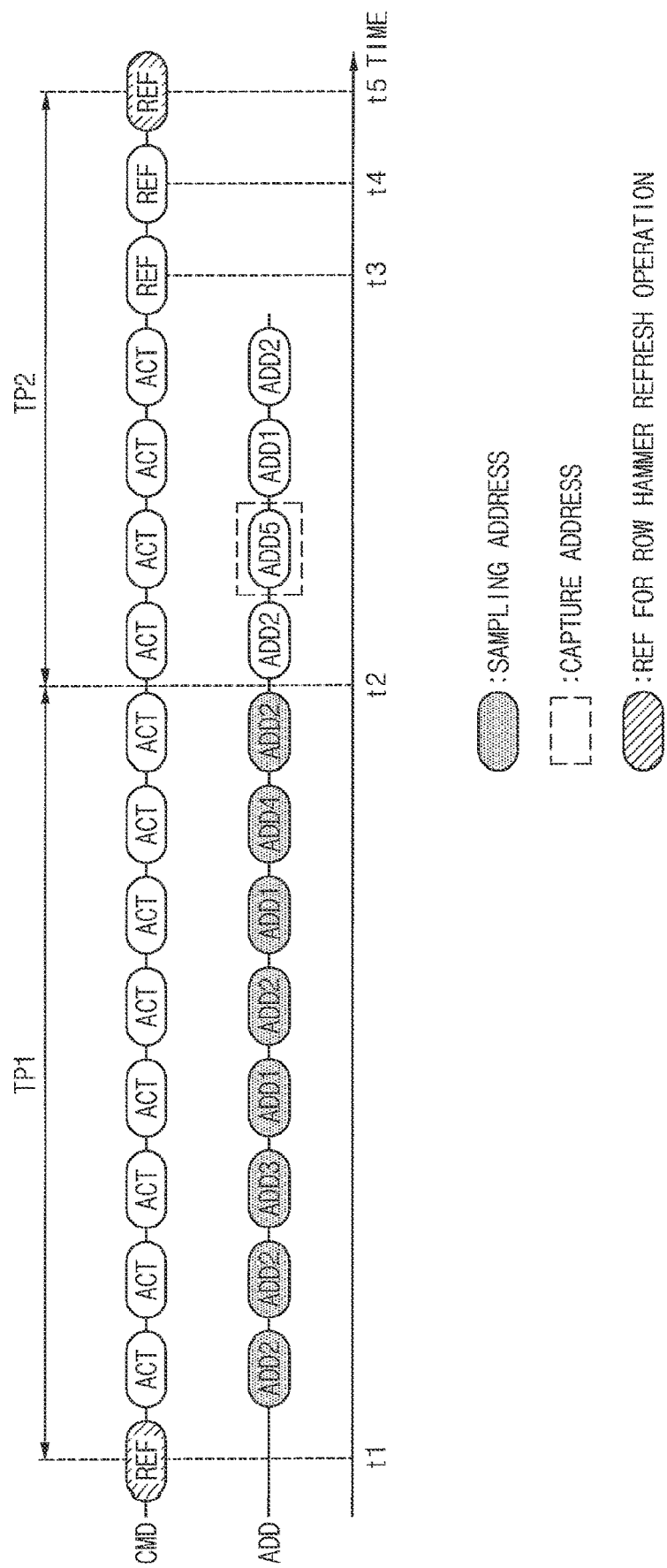
FIG. 4 is a timing diagram illustrating an example of sampling operation and a capturing operation of the memory device according to an exemplary embodiment of the inventive concept.

FIG. 4 is a timing diagram illustrating an example of sampling operation and a capturing operation of the memory device according to an exemplary embodiment of the inventive concept.

Referring to FIGS. 1, 2 and 4, the memory device 200 receives a refresh command REF from the memory controller 100 at a first time point t1. The refresh command REF at the first time point t1 may correspond to a row hammer refresh command. After the first time point t1, the memory device 200 samples a portion of addresses ADD received from the memory controller 100. For example, the memory device 200 may sample the addresses ADD in response to the at the first time point t1, in response to receiving the row hammer refresh command, or after receiving the row hammer refresh command. As illustrated in FIG. 4, the memory device 200 may sample addresses ADD received from the memory controller 100 in response to an active command ACT during a first time period TP1 between the first time point t1 and a second time point t2. Accordingly, first through fourth addresses ADD1~ADD4 are sampled during the first time period TP1. For example, the memory 200 may sample a next address each time it receives a distinct active command ACT after receiving a refresh command REF.

The memory device 200 may halt an operation to sample addresses provided from the memory controller 100 after the second time point t2. Therefore, the memory device 200 does not sample the addresses ADD corresponding to the active commands ACT during a second time period TP2 between the second time point t2 and a fifth time point t5 including a third time point t3 and a fourth time point t4.

The memory device 200 may capture an address from among addresses ADD received from the memory controller 100 after the first time point t1 in response to the refresh command REF. For example, the memory device 200 may capture a fifth address ADD5 received corresponding to the active command ACT. For example, the memory device 200 may capture an address after halting the operation to sample addresses.

The memory device 200 may perform a refresh operation in response to the refresh command REF received at each of the third through fifth time points t3, t4 and t5, respectively. The memory device 200 may perform a normal refresh operation in response to the refresh command REF received at each of third time point t3 and the fourth time point t4 and may perform a row hammer refresh operation in response to the refresh command REF received at the fifth time point t5. The memory device 200 may generate a refresh address based on a maximum access address among from the sampling addresses ADD1~ADD4 or the captured address ADD5 in response to the refresh command REF received at the fifth time point t5.

The refresh command REF received at the fifth time point t5 may correspond to a row hammer refresh command the same as the refresh command REF received at the first time point t1. The refresh command REF received at the fifth time point t5 may be a third refresh command from a previous row hammer refresh command corresponding to the refresh command REF received at the first time point t1.

The memory device 200 may sample a portion of the addresses ADD received from the memory controller 100 and may capture one of the addresses ADD received from the memory controller 100 after the fifth time point t5 in response to the refresh command REF received at the fifth time point t5.

As mentioned above, the memory device 200 may sample and capture a portion of addresses received from the memory controller 100 during a time interval between row hammer refresh commands. The memory device 200 may perform the row hammer refresh operation based on the sampling addresses or the captured address. Examples associated with determining a sampling period and a capturing timing will be described with reference to FIGS. 7 through 11.

FIG. 5 is an example in which the memory device in FIG. 1 manages the sampling addresses and the captured address.

Hereinafter, it will be described that the memory device 200 manages the sampling addresses and the captured address based on an example in FIG. 4 for convenience of explanation.

Referring to FIGS. 1, 4 and 5, the memory device 200 may manage sampling addresses sampled during the first time period TP1 by using sampling registers.

For example, the memory device 200 may store sampling addresses in sampling registers according to receiving order of the addresses ADD. As illustrated in FIG. 5, the memory device 200 stores the second address ADD2 in a first sampling register and stores the third address ADD3 in a second sampling register. The memory device 200 stores the first address ADD1 in a third sampling register and stores the fourth address ADD4 in a fourth sampling register.

The memory device 200 may manage or maintain accesses count of each of the sampling registers. For, example, when the second address ADD2 is sampled four times, the memory device 200 may store a counting value of the first sampling register storing the second address ADD2 with '4'. Similarly, the memory device 200 may store a counting value of the second sampling register storing the third address ADD3 with '1', may store a counting value of the third sampling register storing the first address ADD1 with '2' and may store a counting value of the fourth sampling register storing the fourth address ADD4 with '1'.

The memory device 200 may determine a sampling address whose counting value number is greatest (i.e., maximum) from among the counting values of the sampling addresses ADD1~ADD4 as a maximum access address. The memory device may determine the second address ADD2 stored in the first sampling register as the maximum access address.

The memory device 200 may store the captured address in a capture register. As illustrated in FIG. 5, the memory device 200 may store the fifth address ADD5 in a separate capture address register.

The memory device 200 may generate a refresh address based on the maximum access address or the captured address. For example, the memory device 200 may generate a refresh address based on the second address ADD2 or the fifth address ADD5.

Figure 6:
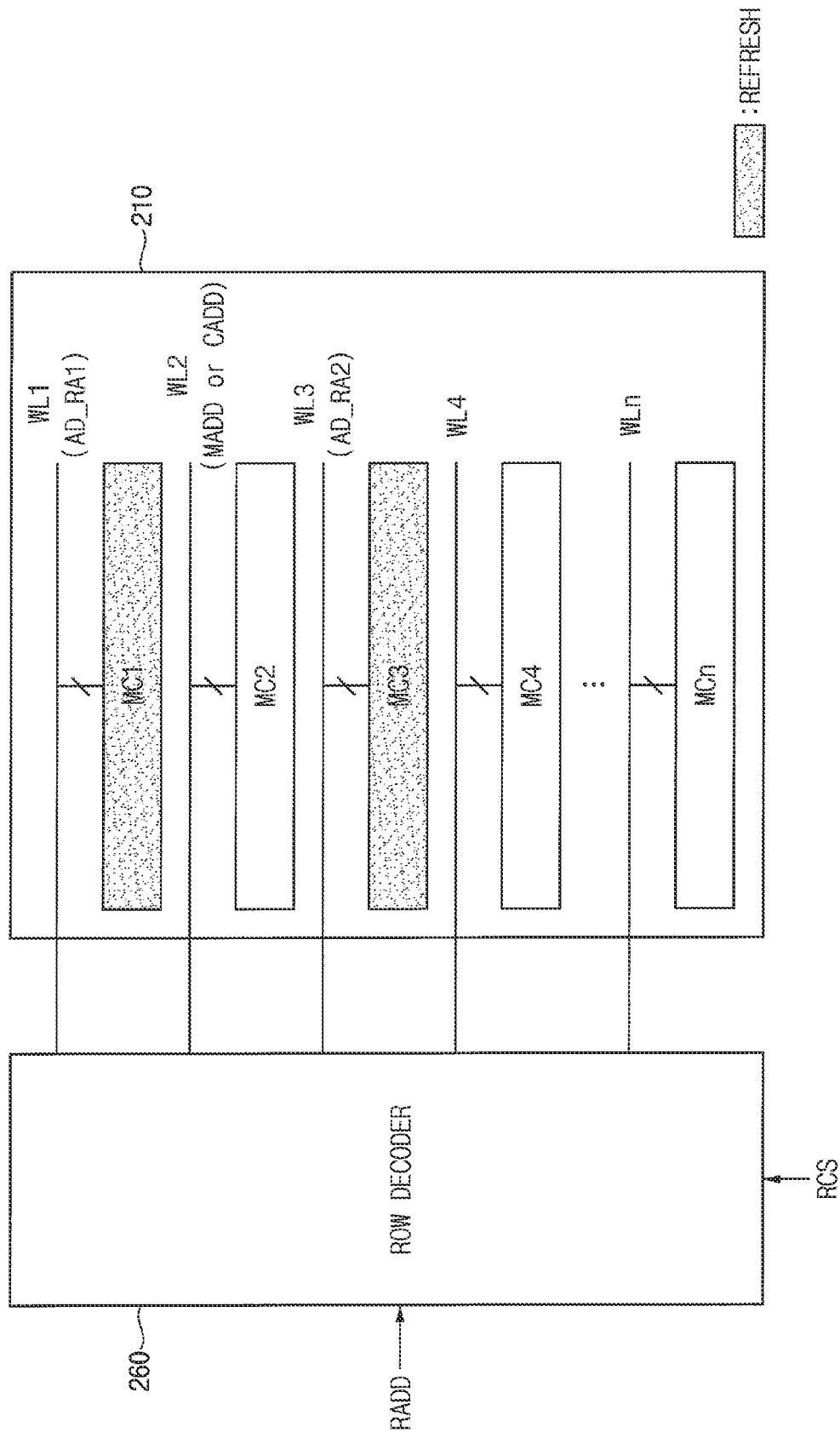
FIG. 6 illustrates an example of a refresh operation performed in the memory device according to an exemplary embodiment of the inventive concept.

FIG. 6 illustrates an example of a refresh operation performed in the memory device according to an exemplary embodiment of the inventive concept.

Referring to FIG. 6, the memory cell array 210 may be coupled to the row decoder 260 through first through n-th word-lines WL1~WLn, where n is an integer greater than four. The memory cell array 210 may include first through n-th memory cells MC1~MCn coupled to a respective one of the first through n-th word-lines WL1~WLn. For example, the first memory cells MC1 may be coupled to the first word-line WL1 and the second memory cells MC2 may be coupled to the second word-line WL2.

The row decoder 260 may enable and disable a word-line corresponding to the refresh address RADD in response to the refresh control signal RCS. Therefore, the memory cells coupled to a word-line designated by the refresh address RADD may be refreshed.

As illustrated in FIG. 6, when an address corresponding to the second word-line WL2 is determined as the maximum access address MADD or the captured address CADD, the memory device 200 may perform a refresh operation based on an address corresponding to the first word-line WL1 and/or the third word-line WL3. The refresh address RADD may include a first adjacent address AD_RA1 corresponding to the first word-line WL1 and a second adjacent address AD_RA2 corresponding to the third word-line WL3.

The row decoder 260 may enable the first word-line WL1 and the third word-line WL3. For example, the row decoder 260 may enable the third word-line WL3 after enabling the first word-line WL1. For example, the row decoder 260 may enable the first word-line WL1 after enabling the third word-line WL3. As the first word-line WL1 and the third word-line WL3 are enabled, the first memory cells MC1 and the third memory cells MC3 are refreshed, and data stored in the first word-line WL1 and the third word-line WL3 are being prevented from being lost due to the second word-line WL being frequently accessed.

Hereinafter, a description on examples in which the memory device performs a sampling operation and capturing operation is provided with reference to FIGS. 7 through 11.

Figure 7:
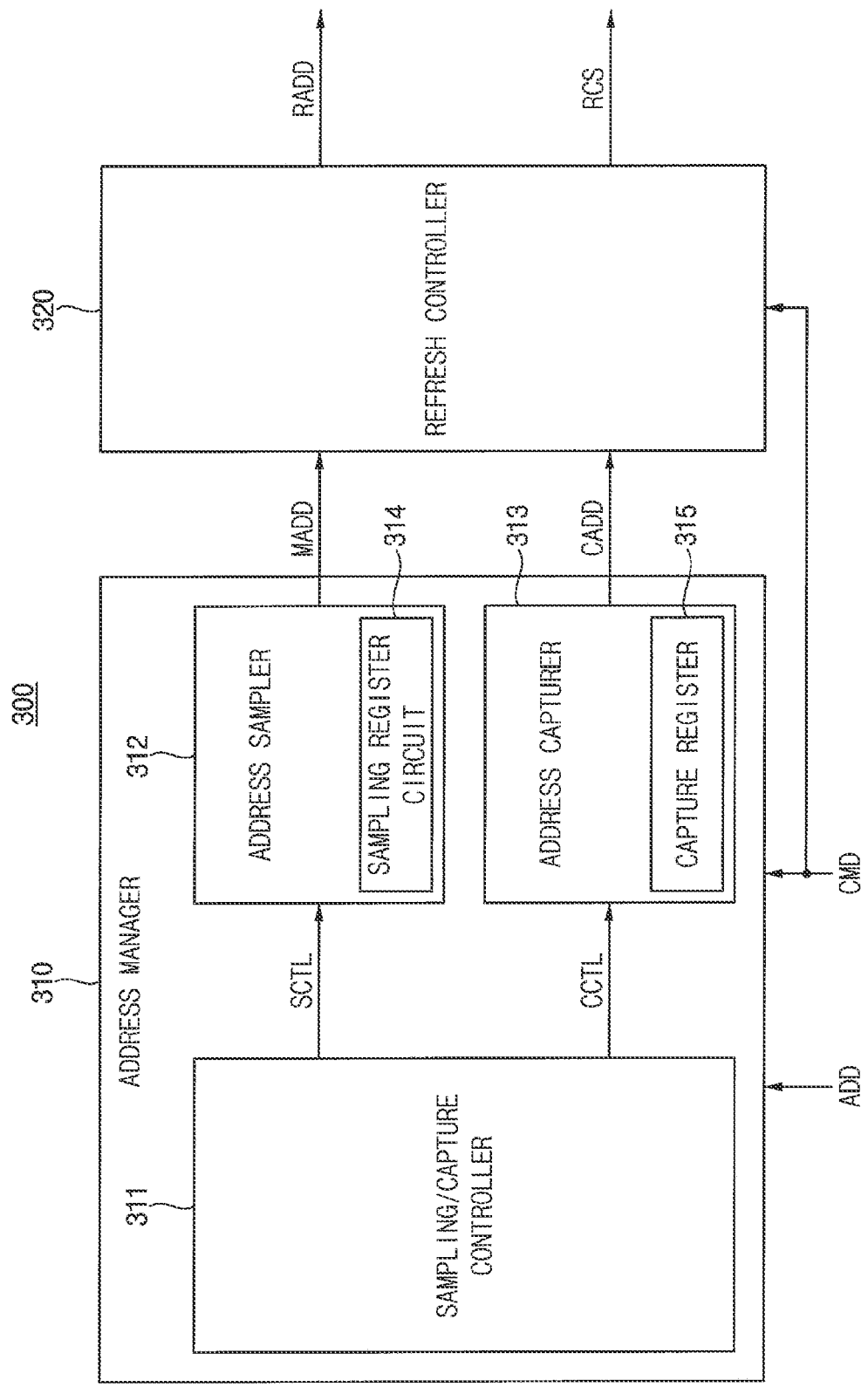
FIG. 7 is a block diagram illustrating an example of a memory device performing a refresh operation according to an exemplary embodiment of the inventive concept.

FIG. 7 is a block diagram illustrating an example of a memory device performing a refresh operation according to an exemplary embodiment of the inventive concept.

A memory device 300 in FIG. 7 may correspond to the memory device 200 described with reference to FIGS. 1 through 6, and thus, repeated description will be omitted.

Referring to FIG. 7, the memory device 300 includes an address manager 310 and a refresh controller 320. The address manager 310 includes a sampling/capture controller 311, an address sampler 312 and an address capturer 313.

The sampling/capture controller 311 may receive the address ADD and the command CMD and may generate control signals SCTL and CCTL associated with sampling and capturing addresses in response to a row hammer refresh command. The sampling/capture controller 311 may determine a sampling period and a capturing timing based on a time interval between the row hammer refresh commands. For example, the sampling/capture controller 311 may determine sampling addresses and a captured address from among the access addresses accessed by a memory controller (the memory controller 100 in FIG. 1) during a time interval between two row hammer refresh commands. The sampling/capture controller 311 may generate the control signals SCTL and CCTL such that the sampling operation is performed on the addresses during the sampling period and the capturing operation is performed on the addresses at the capturing timing.

The sampling/capture controller 311 may determine the sampling period and the capturing timing based on a time interval (referred to as 'a refresh time interval) between the row hammer refresh commands. The sampling/capture controller 311 may determine a duration of the sampling period (or number of the sampling addresses) and the captured address based on the refresh time interval. In an exemplary embodiment, the sampling/capture controller 311 determines the sampling period and the capturing timing randomly. For example, even when the duration of the sampling period is regular, a sampling starting timing and/or a sampling ending timing may be randomly varied. However, exemplary embodiments of the inventive concept are not limited thereto. For example, even if the refresh time interval is the same, a duration of the sampling period (the number of the sampling addresses) may be randomly varied.

In an exemplary embodiment, the refresh time interval is stored in a mode register in the memory device 300 based on a mode register set command from the memory controller 100. For example, the refresh time interval may be set based on the mode register set command during an initialization process of the memory device. The sampling/capture controller 311 may determine the sampling period and the capturing timing based on the refresh time interval between the two row hammer refresh commands.

In an exemplary embodiment, the sampling/capture controller 311 determines the sampling period and the capturing timing based on a number of active commands provided from the memory controller during the refresh time interval between the two row hammer refresh commands. For example, the sampling/capture controller 311 may count the number of active commands provided from the memory controller during a first time interval between a first row hammer refresh command and a second row hammer refresh command. The sampling/capture controller 311 may determine the sampling period and the capturing timing during a second time interval between the second row hammer refresh command and a third row hammer refresh command based on the number of active commands counted during the first time interval. For example, the number of active commands may be determined based on the refresh time interval, but exemplary embodiments of the inventive concept are not limited thereto. For example, when the refresh time interval is regular, the number of active commands may be varied in each of different time intervals.

As described above, the sampling/capture controller 311 may determine the sampling period and the capturing timing based on the refresh time interval or the number of active commands. Hereinafter, a description is provided on examples in which the sampling/capture controller 311 determines the sampling period and the capturing timing based on the refresh time interval for convenience of explanation.

The sampling/capture controller 311 may generate a sampling control signal SCTL based on the determined sampling period and provide the sampling control signal SCTL to the address sampler 312. The sampling/capture controller 311 may generate a capture control signal CCTL based on the determined capturing timing and provide the capture control signal CCTL to the address capturer 313.

The address sampler 312 may sample the addresses ADD based on the sampling control signal SCTL. The address sampler 312 may store the sampling addresses in a sampling register circuit 314. For example, the address sampler 312 may store each of the sampling addresses in respective one of a plurality of sampling registers within the sampling register circuit 314.

The address sampler 312 may determine the maximum access address MADD based on the sampling addresses stored in the sampling register circuit 314. The address sampler 312 may determine the maximum access address MADD in response to the row hammer refresh command. The address sampler 312 may provide the maximum access address MADD to the refresh controller 320.

The address capturer 313 may capture an address ADD which is received based on the capture control signal CCTL. The address capturer 313 may store the captured address CADD in a capture register 315. The address capturer 313 may provide the captured address CADD to the refresh controller 320.

In an exemplary embodiment, the refresh controller 230 generates the refresh address RADD based on the maximum access address MADD or the captured address CADD. The refresh controller 230 may generate the refresh address RADD by sequentially using the maximum access address MADD or the captured address CADD. For example, the refresh controller 230 may generate the refresh address RADD based on the maximum access address MADD in response to the first row hammer refresh command and may generate the refresh address RADD based on the captured address CADD in response to the second row hammer refresh command. In an embodiment, the refresh address RADD corresponds to at least one word-line adjacent to a selected word-line corresponding to a selected address from the maximum access address MADD and the captured address CADD.

The refresh controller 320 may generate the refresh address RADD and the refresh control signal RCS. The refresh controller 320 may provide the refresh address RADD and the refresh control signal RCS to a row decoder (for example, the row decoder 260 in FIG. 6). As described with reference to FIG. 6, the row decoder may refresh memory cells corresponding to the refresh address RADD.

Figure 8A:
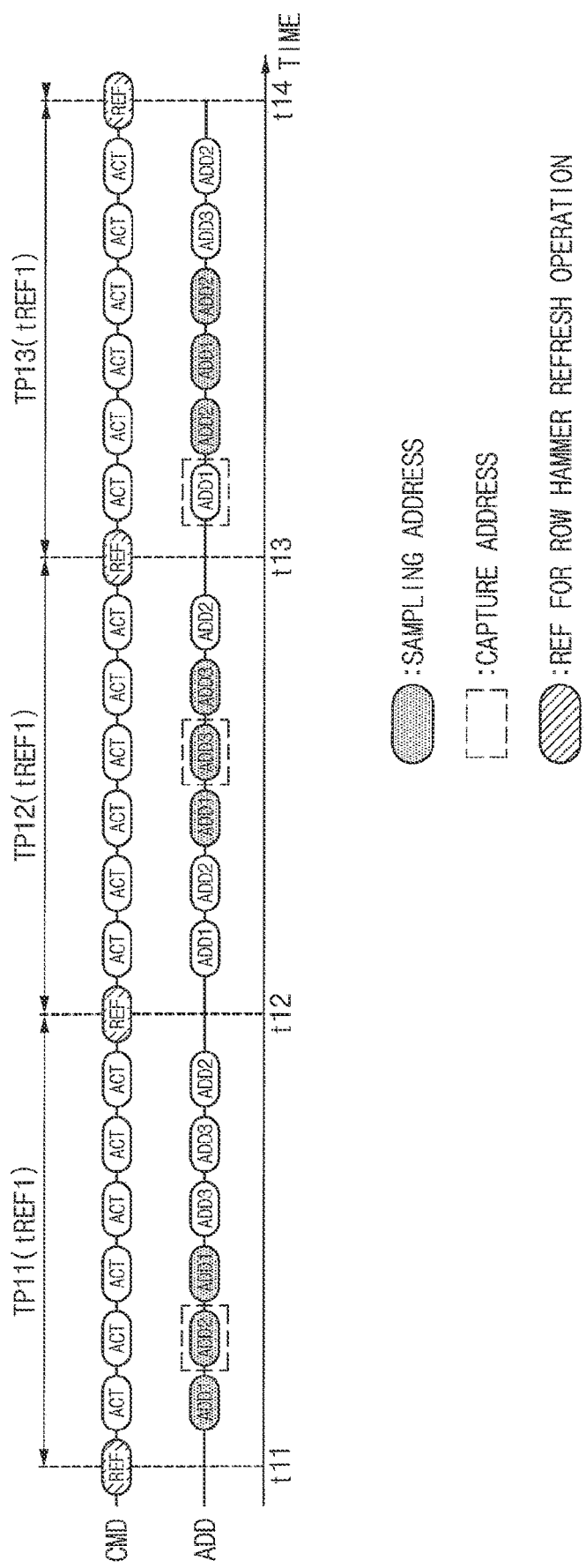
FIGS. 8A and 8B are timing diagrams illustrating examples in which the memory device performs a sampling operation and capturing operation according to exemplary embodiments of the inventive concept.
Figure 8B:
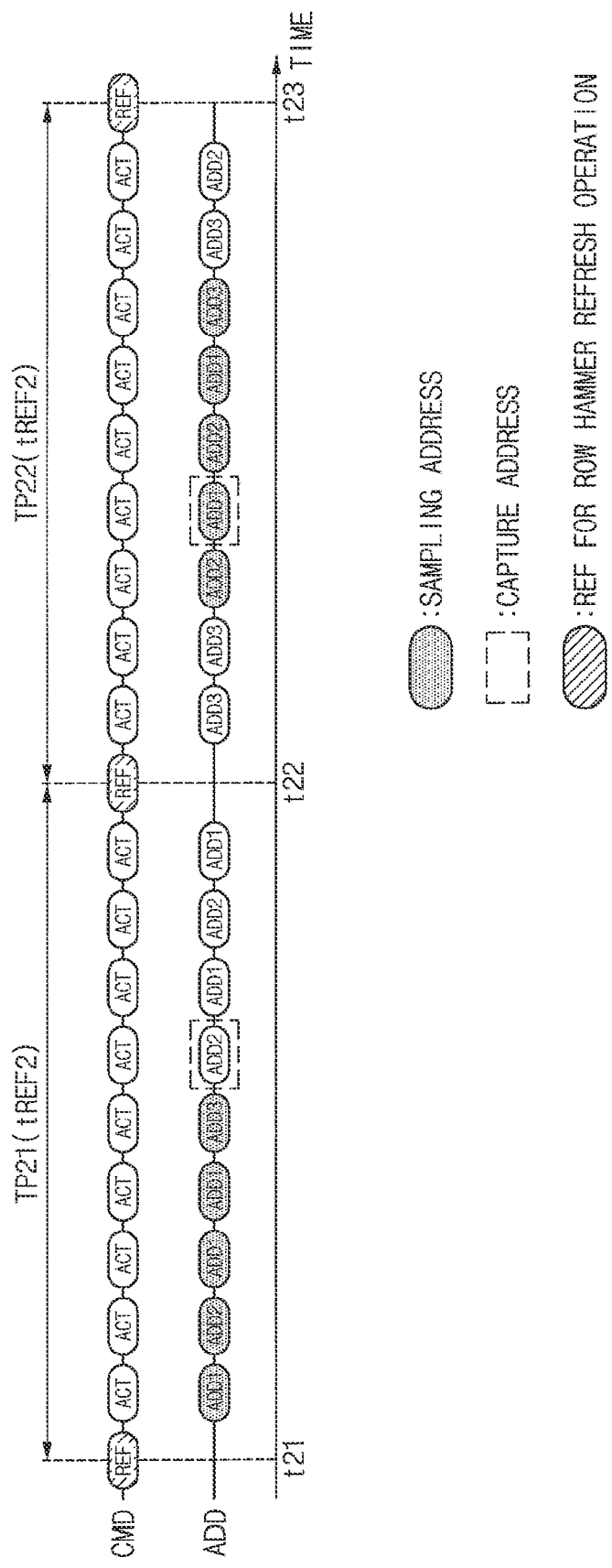

FIGS. 8A and 8B are timing diagrams illustrating examples in which the memory device performs a sampling operation and capturing operation according to example embodiments.

Referring to FIGS. 7 and 8A, the memory device 300 receives a refresh command REF at respective one of a first time point t11, a second time point t12, a third time point t13 and a fourth time point t14. Each refresh command REF may be a row hammer refresh command associated with a row hammer refresh operation. As illustrated in FIG. 8A, each time interval between consecutive two refresh commands REF may correspond to a first refresh time interval tREF1 and may be identical with each other.

The memory device 300 may determine a sampling period and a capturing timing based on the first refresh time interval tREF1. For example, the memory device 300 may determine a sampling period such that three addresses are sampled and may determine the capturing timing such that each of six addresses is captured with a same probability. In this example, a sampling starting time for each of first, second and third time periods TP11, TP12 and TP13 may be different from each other and capturing timing for each of the first, second and third time period TP11, TP12 and TP13 may be different from each other. The first time period TP11 correspond to a time interval between the first time point t11 and the second time point t12, the second time period TP12 correspond to a time interval between the second time point t12 and the third time point t13 and the third time period TP13 correspond to a time interval between the third time point t13 and the fourth time point t14.

For example, the memory device 300 may sample first through three addresses and may capture a second address in response to the refresh command REF at the first time point t11, from among six addresses ADD received in response to the active commands ACT from the first time point t11 to the second time point t12 at which the refresh command REF is received. Therefore, the first address ADD1 is sampled twice, the second address ADD2 is sampled once and the second address ADD2 is captured.

For example, the memory device 300 may sample third through fifth addresses and may capture a fourth address in response to the refresh command REF at the second time point t12, from among six addresses ADD received in response to the active commands ACT from the second time point t12 to the third time point t13 at which the refresh command REF is received. Therefore, the first address ADD1 is sampled once, the third address ADD3 is sampled twice and the third address ADD3 is captured.

For example, the memory device 300 may sample second through fourth addresses and may capture a first address in response to the refresh command REF at the third time point t13, from among six addresses ADD received in response to the active commands ACT from the third time point t13 to the fourth time point t14 at which the refresh command REF is received. Therefore, the first address ADD1 is sampled once, the second address ADD2 is sampled twice and the first address ADD1 is captured.

Referring to FIGS. 7 and 8B, the memory device 300 receives a refresh command REF at respective one of a first time point t21, a second time point t22 and a third time point t23. Each refresh command REF may be a row hammer refresh command associated with a row hammer refresh operation. As illustrated in FIG. 8B, each time interval between consecutive two refresh commands REF may correspond to a second refresh time interval tREF2 and may be identical with each other.

The memory device 300 may determine a sampling period and a capturing timing based on the second refresh time interval tREF2. For example, the memory device 300 may determine a sampling period such that five addresses are sampled and may determine the capturing timing such that each of nine addresses is captured with a same probability. In this example, a sampling starting time for each of first and second time periods TP21 and TP22 may be different from each other and capturing timing for each of the first and second time periods TP21 and TP22 may be different from each other. The first time period TP21 correspond to a time interval between the first time point t21 and the second time point t22 and the second time period TP22 correspond to a time interval between the second time point t22 and the third time point t23.

For example, the memory device 300 may sample first through fifth addresses and may capture a sixth address in response to the refresh command REF at the first time point t21, from among nine addresses ADD received in response to the active commands ACT from the first time point t21 to the second time point t22 at which the refresh command REF is received. Therefore, the first address ADD1 is sampled three times, the second address ADD2 is sampled once, the third address ADD3 is sampled once and the second address ADD2 is captured.

For example, the memory device 300 may sample third through seventh addresses and may capture a fourth address in response to the refresh command REF at the second time point t22, from among nine addresses ADD received in response to the active commands ACT from the second time point t22 to the third time point t23 at which the refresh command REF is received. Therefore, the first address ADD1 is sampled twice, the second address ADD2 is sampled twice, the third address ADD3 is sampled once and the first address ADD1 is captured.

As illustrated in FIGS. 8A and 8B, even when each of the refresh time intervals is identical to each other, the sampling period and the capture timing may be varied between the row hammer refresh commands. For example, the sampling period and the capture timing may be randomly determined.

When examples in FIGS. 8A and 8B are compared with respect to each other, a number of sampling addresses (a duration of a sampling period) may vary as the refresh time interval varies. For example, a number of the sampling addresses based on the first refresh time interval tREF1 may be smaller than a number of the sampling addresses based on the second refresh time interval tREF2. In addition, when each of the refresh time intervals varies, a frequency of capturing operation may vary. For example, a frequency of a capturing operation based on the first refresh time interval tREF1 may be greater than a frequency of a capturing operation based on the second refresh time interval tREF2.

Examples in FIGS. 8A and 8B are examples for explaining the sampling operation and the capturing operation according to exemplary embodiments of the inventive concept, but the inventive concept is not limited thereto. In example embodiments, the duration of the sampling period and the number of the sampling addresses may vary even when each of the refresh time intervals is maintained with a regular time interval. For example, the memory device 300 may sample three addresses ADD during the first time period TP11 based on the first refresh time interval tREF1 and may sample four addresses ADD during the second time period TP12 based on the first refresh time interval tREF1.

FIG. 9 is a timing diagram illustrating an example in which the memory device in FIG. 7 selects an address for a refresh operation based on an example in FIG. 8A.

Referring to FIGS. 8A and 9, the memory device 300 manages the sampling addresses sampled during the first time period TP11 and the captured address captured during the first time period TP11 by using sampling registers and a capture register.

For example, the memory device 300 may store the first address ADD1 in the first sampling register, may store the second address ADD2 in the second sampling register and may store the second address ADD2 in the capture register. Since the first address ADD1 is sampled twice and the second address ADD2 is sampled once during the first time period TP11, the memory device 300 may store a counting value corresponding to the first sampling register as '2' and may store a counting value corresponding to the second sampling register as '1'.

The memory device 300 may determine the first address ADD1, stored in the first sampling register, corresponding to a maximum counting value as the maximum access address in response to the refresh command REF at the second time point t12. The memory device 300 may perform a refresh operation by selecting one of the first address ADD1 corresponding to the maximum access address and the second address ADD2 corresponding to the captured address. For example, the memory device 300 may perform a refresh operation based on the first address ADD1 corresponding to the maximum access address as illustrated in FIG. 9. The memory device 300 may reset the counting value associated with the first sampling register storing a selected address to '0' after performing the refresh operation.

The memory device 300 may manage the sampling addresses sampled during the second time period TP12 and the captured address captured during the second time period TP12 by using the sampling registers and the capture register after the memory device 300 performs the refresh operation at the second time point t12.

For example, the memory device 300 may store the third address ADD3 in the third sampling register and may store the third address ADD3 in the capture register. Since the first address ADD1 is sampled once and the third address ADD3 is sampled twice during the second time period TP12, the memory device 300 may update the counting value corresponding to the first sampling register as '1' and may update the counting value corresponding to the third sampling register as '2'. The counting value corresponding to the second sampling register may be maintained with '1'.

The memory device 300 may determine the third address ADD3, stored in the third sampling register, corresponding to a maximum counting value as the maximum access address in response to the refresh command REF at the third time point t13. The memory device 300 may perform a refresh operation by selecting one of the third address ADD3 corresponding to the maximum access address and the third address ADD3 corresponding to the captured address. For example, the memory device 300 may perform a refresh operation based on the third address ADD3 corresponding to the captured address as illustrated in FIG. 9. The memory device 300 may reset the counting value associated with the third sampling register storing a selected address to '0' after performing the refresh operation.

The memory device 300 may manage the sampling addresses sampled during the third time period TP13 and the captured address captured during the third time period TP13 by using the sampling registers and the capture register after the memory device 300 performs the refresh operation at the third time point t13.

For example, the memory device 300 may store the first address ADD1 in the capture register. Since the first address ADD1 is sampled once and the second address ADD2 is sampled twice during the third time period TP13, the memory device 300 may update the counting value corresponding to the first sampling register as '2' and may update the counting value corresponding to the second sampling register as '3'. The counting value corresponding to the third sampling register may be maintained with '0' because the third address ADD3 is not sampled during the third time period TP13.

The memory device 300 may determine the second address ADD2, stored in the second sampling register, corresponding to a maximum counting value as the maximum access address in response to the refresh command REF at the fourth time point t14. The memory device 300 may perform a refresh operation by selecting one of the second address ADD2 corresponding to the maximum access address and the first address ADD1 corresponding to the captured address. For example, the memory device 300 may perform a refresh operation based on the second address ADD2 corresponding to the maximum access address as illustrated in FIG. 9. The memory device 300 may reset the counting value associated with the third sampling register storing a selected address to '0' after performing the refresh operation.

As described above, the memory device 300 may perform a refresh operation by sequentially using the maximum access address and the captured address when the memory device 300 performs a row hammer refresh operation. However, exemplary embodiments of the inventive concept are not limited thereto. The memory device 300 may select one of the maximum access address and the captured address in various ways and may perform a refresh operation based on the selected address.

Figure 10:
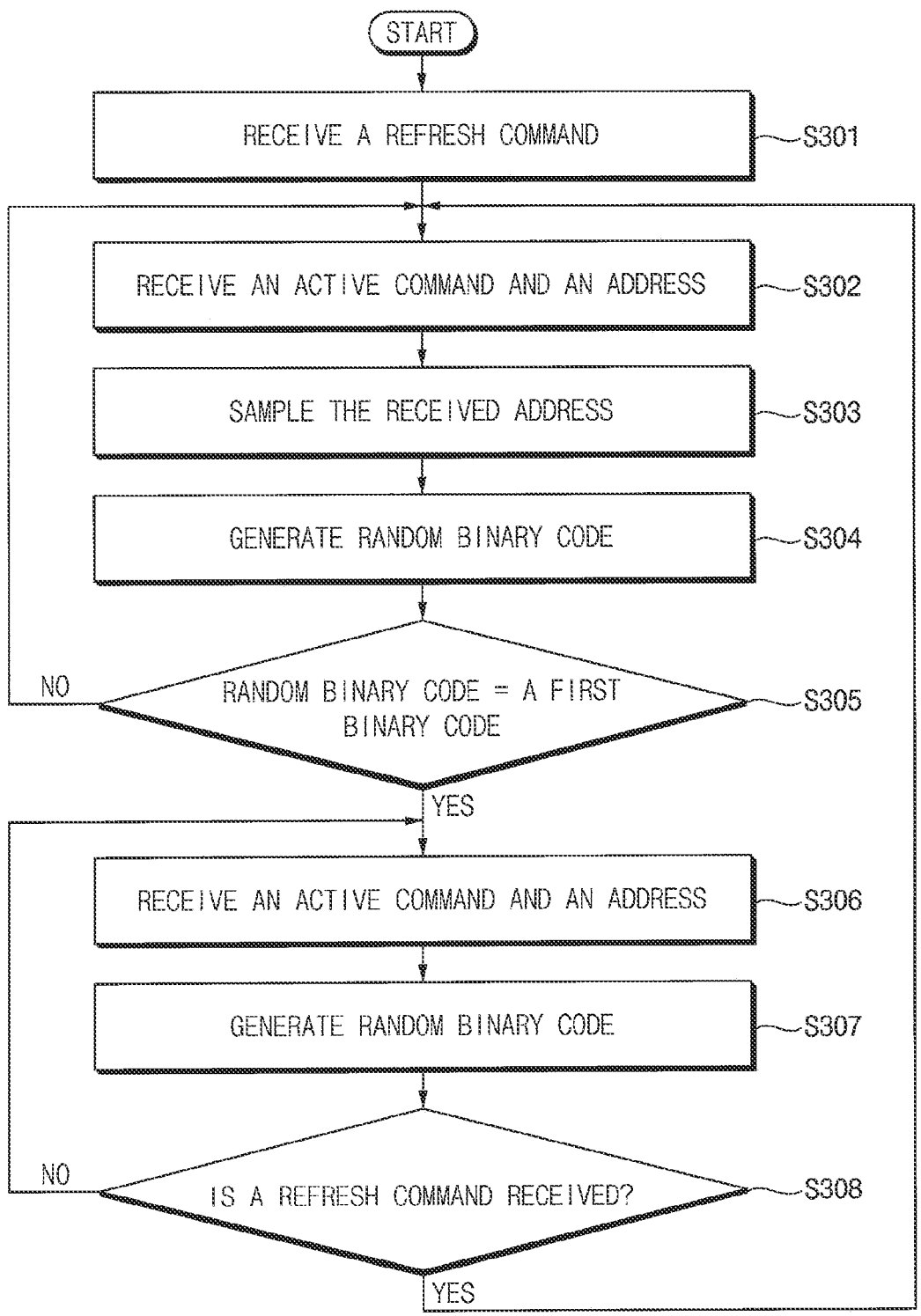
FIG. 10 is a flow chart illustrating an example of sampling operation of the memory device in FIG. 7 according to an exemplary embodiment of the inventive concept.

FIG. 10 is a flow chart illustrating an example of sampling operation of the memory device in FIG. 7 according to an exemplary embodiment of the inventive concept.

In particular, FIG. 10 illustrates an example of the memory device 300 randomly determining a sampling period based on a refresh time interval.

Referring to FIGS. 7 and 10, in operation S301, the memory device 300 receives a refresh command from a memory controller (for example, the memory controller 100 in FIG. 1). The refresh command may correspond to a row hammer refresh command.

In operation S302, the memory device 300 receives an active command and an address. For example, the memory device 300 may receive one active command and one address corresponding to the one active command.

In operation S303, the memory device 300 samples received address. For example, the memory device 300 may sample an address received at a first time from the memory controller after receiving the refresh command. For example, the memory device 300 may store the received address in a sampling register and may increment a counting value corresponding to the sampling register. When a sampling register storing the address which is the same as the received address already exists, the memory device 300 may increment a counting value corresponding to the sampling register, and thus, the counting value corresponding to the sampling register may be updated.

In operation S304, the memory device 300 generates a random binary code. For example, the memory device 300 may generate the random binary code in response to an active command. In an exemplary embodiment, the memory device 300 generates the random binary code based on a linear feedback shift register. The random binary code may be a pseudo random sequence.

In operation S305, the memory device 300 determines whether the random binary code matches (i.e., is the same as) a first binary code. The first binary code may be the same as one of a plurality of random binary codes which the memory device 300 is capable of generating. In an exemplary embodiment, the memory device 300 generates the first binary code based on a refresh time interval. For example, a number of the first binary code may vary based on the refresh time interval. For example, the memory device 300 may generate one first binary code based on a first refresh time interval and may generate a plurality of first binary codes based on a second refresh time interval smaller than the first refresh time interval.

For example, the memory device 300 may store the first binary code in a separate register. The memory device 300 may compare the generated random binary code with the first binary code stored in the separate register. When the memory device 300 generates the random binary code which is periodically repeated (that is, when the random binary code is a pseudo random sequence), the memory device 300 may periodically generate a random binary code which is the same as the first binary code. When the number of the first binary code varies based on the refresh time interval, a frequency of generating a random binary code which is the same as the first binary code may vary.

When the random binary code is not the same as the first binary code (No in operation S305), the memory device 300 repeats the operations S302, S303, S304 and S305. Therefore, the memory device 300 may sample addresses received from the memory controller 100. The memory device 300 may sample addresses received from the memory controller 100 until the memory device 300 determines that the random binary code is the same as the first binary code.

When the random binary code is the same as the first binary code (YES in operation S305), in operation S306, the memory device 300 receives a refresh command from the memory controller 100. The memory device 300 may additionally receive an address during operation S306. In operation S307, the memory device 300 generates a random binary code in response to the active command. The memory device 300 does not sample addresses received from the memory controller 100 after the memory device 300 determines that the random binary code is the same as the first binary code.

In operation S308, the memory device 300 determines whether a refresh command is received. The determining of whether a refresh command is received may including determining whether a row hammer refresh command is received. The memory device 300 may identify the row hammer refresh command from among the refresh commands received from the memory controller 100 according to a pre-determined refresh time interval. Alternatively, the memory device 300 may identify the row hammer refresh command based on a number of the refresh commands received from the memory controller 100 after receiving a previous row hammer refresh command.

When the refresh command is not received (NO in operation S308), the memory device 300 repeats the operations S306, S307 and S308. Therefore, the memory device 300 does not sample addresses received from the memory controller 100 until the memory device 300 receives the refresh command. When the refresh command is received (YES in operation S308), the memory device 300 may repeat the operations S302 through S307. Therefore, the memory device 300 may sample addresses received from the memory controller 100 and may determine whether to sample addresses based on a generated random binary code.

In an exemplary embodiment, even when the random binary code is the same as the first binary code, the memory device 300 updates an address stored in a sampling register. For example, when the received address is not the same as an address stored in the sampling register, the memory device 300 may store the received address in a new sampling register. When the received address is not the same as an address stored in the sampling register and a new sampling register is not available, the memory device 300 may store the received address in one of the sampling registers storing different addresses.

For example, the memory device 300 may store the received address in a sampling register corresponding to a minimum counting value. In this example, the memory device 300 does not increment a counting value of the sampling register storing the received address.

As described above, the memory device 300 may randomly determine a sampling period by comparing the random binary code with the first binary code which is generated based on the refresh time interval. In this example, a duration of the sampling period may vary based on the refresh time interval. For example, the memory device 300 may generate one first binary code based on a first refresh time interval and may generate a plurality of first binary codes based on a second refresh time interval smaller than the first refresh time interval. As the number of the first binary codes increases, a frequency of generating a random binary code which is the same as the first binary code increases, and thus, a duration of the sampling period corresponding to the second refresh time interval may be smaller than a duration of the sampling period corresponding to the first refresh time interval. Therefore, a duration of the sampling period decreases as the refresh time interval decreases.

Figure 11:
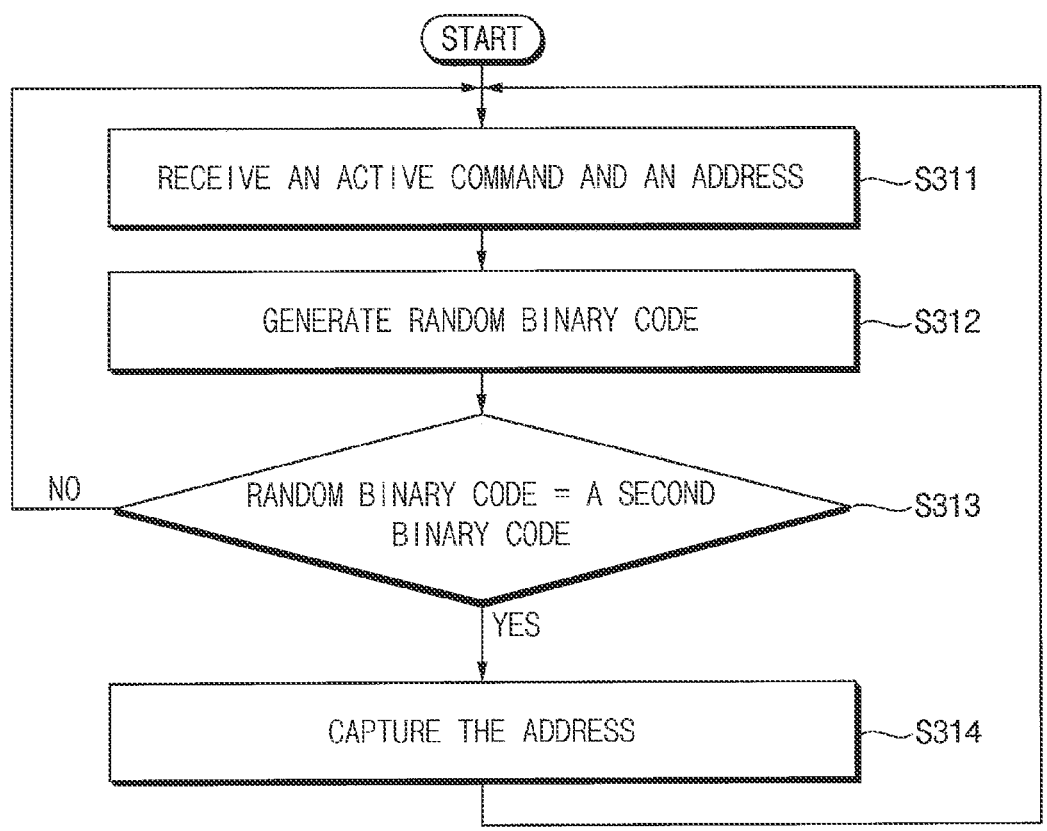
FIG. 11 is a flow chart illustrating an example of a capturing operation of the memory device in FIG. 7 according to an exemplary embodiment of the inventive concept.

FIG. 11 is a flow chart illustrating an example of a capturing operation of the memory device in FIG. 7 according to an exemplary embodiment of the inventive concept.

Referring to FIGS. 7 and 11, in operation S311, the memory device 300 receives an active command and an address. For example, the memory device 300 may receive one active command and one address corresponding to the one active command.

In operation S312, the memory device 300 generates a random binary code. For example, the memory device 300 may generate the random binary code in response to an active command. In an exemplary embodiment, the memory device 300 generates the random binary code based on a linear feedback shift register. The random binary code may be a pseudo random sequence. For example, a random binary code for sampling and a random binary code for capturing may be generated through a same random bit generator. However, exemplary embodiments of the inventive concept are not limited thereto as a random binary code for sampling and a random binary code for capturing may be generated through different random bit generators, respectively.

In operation S313, the memory device 300 determines whether the random binary code matches (i.e., is the same as) a second binary code. The second binary code may be the same as one of a plurality of random binary codes which the memory device 300 is capable of generating. In example embodiments, the memory device 300 may generate the second binary code based on a refresh time interval. For example, a number of the second binary code may vary based on the refresh time interval.

For example, the memory device 300 may store the second binary code in a separate register. The memory device 300 may compare the random binary code with the second binary code stored in the separate register. When the memory device 300 generates the random binary code which is periodically repeated (that is, when the random binary code is a pseudo random sequence), the memory device 300 may periodically generate a random binary code which is the same as the second binary code. When the number of the second binary code varies based on the refresh time interval, a frequency of generating a random binary code which is the same as the second binary code may vary. In exemplary embodiments, the second binary code generated for capturing may be different from the first binary code generated for sampling, but the inventive concept is not limited thereto.

When the random binary code is the same as the second binary code (YES in operation S305), in operation S314, the memory device 300 captures the received address. For example, the memory device 300 may store an address in a capture register. The memory device 300 may repeat the operations S311, S312 and S313 after performing the operation S314. For example, when the random binary code is the same as the second binary code generated based on an active command received after capturing the address in the operation S314, the memory device 300 may update an address stored in the capture address based on the received address.

When the random binary code is not the same as the second binary code (NO in operation S305), the memory device 300 repeats the operations S311, S312 and S313. The memory device 300 does not capture addresses received from the memory controller 100 until the memory device 300 determines that the random binary code is the same as the second binary code.

As described above, the memory device 300 may randomly determine a capturing timing by comparing the random binary code with the second binary code, which is generated based on the refresh time interval. In this example, a frequency of capturing operation may vary based on the refresh time interval. For example, the memory device 300 may generate one second binary code based on a first refresh time interval and may generate a plurality of second binary codes based on a second refresh time interval smaller than the first refresh time interval. As the number of the second binary codes increases, a frequency of generating a random binary code which is the same as the second binary code increases, and thus, a frequency of a capturing operation corresponding to the second refresh time interval may be greater than a frequency of a capturing operation corresponding to the first refresh time interval.

Examples in FIGS. 10 and 11 are examples for explaining that the sampling period and the capturing timing are randomly determined according to exemplary embodiments, but the inventive concept is not limited thereto.

Hereinafter, a description is provided on examples in which the memory device generates a refresh address based on the maximum access address and the captured address with reference to FIGS. 12 through 14.

Figure 12:
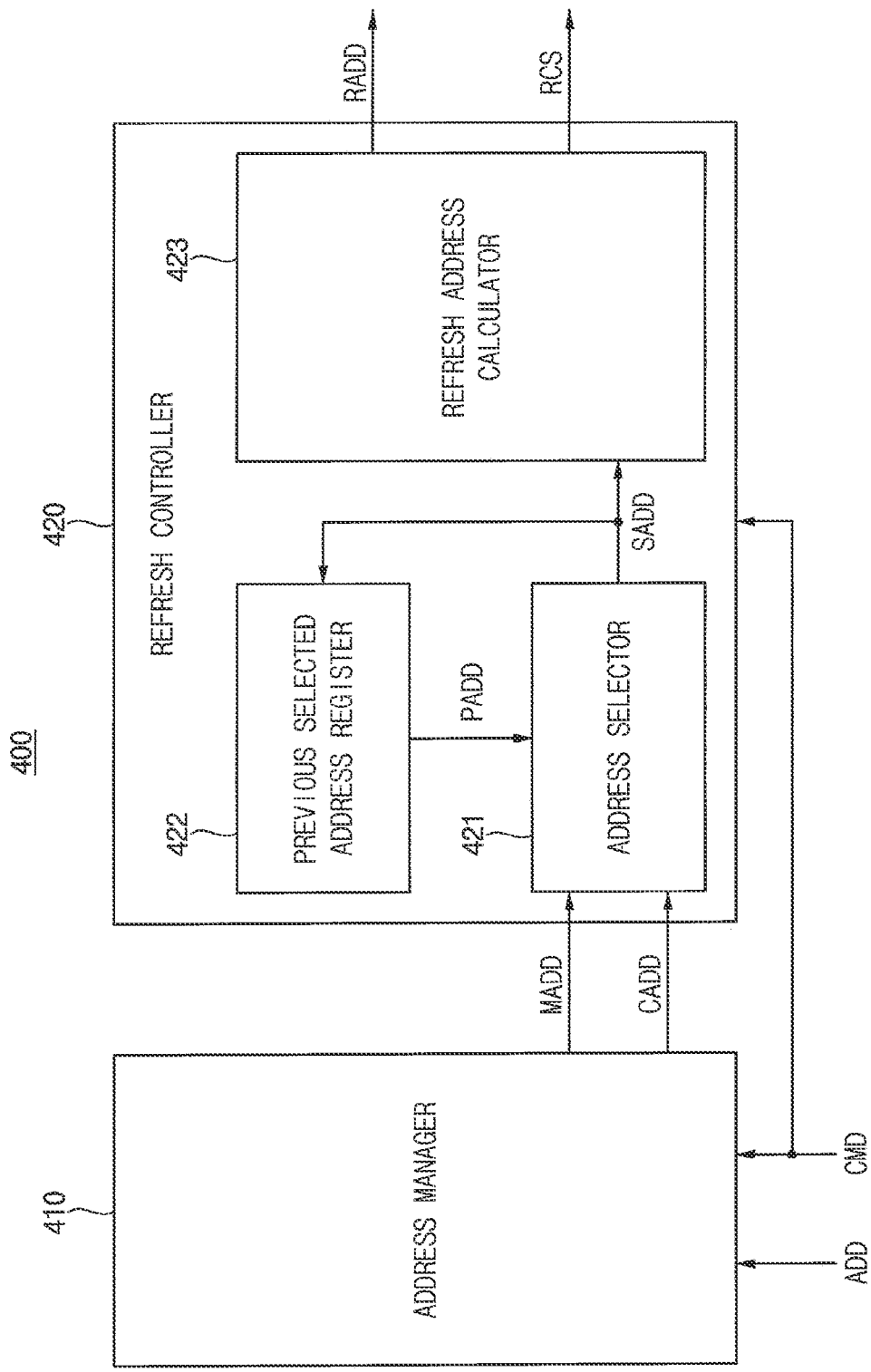
FIG. 12 is a block diagram illustrating an example of a memory device performing a refresh operation according to an exemplary embodiment of the inventive concept.

FIG. 12 is a block diagram illustrating an example of a memory device performing a refresh operation according to an exemplary embodiment of the inventive concept.

A memory device 400 in FIG. 12 may correspond to the memory device 200 described with reference to FIGS. 1 through 6, and thus, repeated description will be omitted.

Referring to FIG. 12, the memory device 400 includes an address manager 410 and a refresh controller 420.

The address manager 410 receives the address ADD and the command CMD. The address manager 410 samples and captures at least one of the received addresses ADD. The address manager 410 may manage sampling addresses and a capture address through separate registers. The address manager 410 may determine a maximum access address MADD from among the sampling addresses. The address manager 410 may provide the maximum access address MADD and a captured address CADD to the refresh controller 420.

The refresh controller 420 includes an address selector 421, a previous selected address register 422 and a refresh address calculator 423. The refresh controller 420 may receive the command CMD.

In an exemplary embodiment, the address selector 421 compares the maximum access address MADD and the captured address CADD with at least one previous selected address PADD and outputs one of the maximum access address MADD and the captured address CADD as a selected address SADD based on a result of the comparison. The address selector 421 may output the selected address SADD in response to a row hammer refresh command. Therefore, a row hammer refresh operation may be performed based on the selected address SADD. The selected address SADD may be provided to the previous selected address register 422 and the refresh address calculator 423.

The previous selected address register 422 may store the selected address SADD provided from the address selector 421. The previous selected address register 422 may store an address selected for a row hammer refresh operation. The memory device 400 may manage an address selected for a row hammer refresh operation through the previous selected address register 422.

The previous selected address PADD output from the previous selected address register 422 may include the selected address SADD output from the address selector 421 in response to a previous row hammer refresh command.

For example, the previous selected address register 422 may store a first selected address selected based on a first row hammer refresh command. The first selected address stored in the previous selected address register 422 may be provided to the address selector 421 as the previous selected address PADD. The address selector 421 may compare the maximum access address MADD and the captured address CADD with the first selected address to output a second selected address. For example, the address selector 421 may output an address from the maximum access address MADD and the captured address CADD, which is not the same as the first selected address, as the second selected address. The previous selected address register 422 may store the second selected address output from the address selector 421.

The refresh address calculator 423 generates a refresh address RADD based on the selected address SADD. The refresh address RADD may correspond to at least one word-line adjacent to a word-line corresponding to the selected address SADD. The refresh address calculator 423 may generate a refresh control signal RCS for refreshing memory cells corresponding to the refresh address RADD.

As described above, the memory device 400 may manage an address selected in a previous row hammer refresh operation. The memory device 400 may perform a row hammer refresh operation based on an address which is not selected in a previous row hammer refresh operation. Therefore, the memory device 400 may refresh memory cells which are not refreshed, thereby enhancing data integrity.

FIG. 13 illustrates an example in which the address selector in FIG. 12 outputs the selected address.

In FIGS. 12 and 13, the address selector 421 compares the maximum access address MADD and the captured address CADD with at the previous selected address PADD and outputs the selected address SADD based on a result of the comparison.

When the maximum access address MADD is the same as the previous selected address PADD and the captured address CADD is not the same as the previous selected address PADD, the address selector 421 outputs the captured address CADD as the selected address SADD. The memory device 400 may perform the row hammer refresh operation based on the captured address CADD. This prevents refreshing of memory cells adjacent the maximum access address MADD that have recently been refreshed.

When the maximum access address MADD is not the same as the previous selected address PADD and the captured address CADD is the same as the previous selected address PADD, the address selector 421 outputs the maximum access address MADD as the selected address SADD. The memory device 400 may perform the row hammer refresh operation based on the maximum access address MADD. This prevents refreshing of memory cells adjacent the captured address CADD that have recently been refreshed.

When the maximum access address MADD is not the same as the previous selected address PADD and the captured address CADD is not the same as the previous selected address PADD, the address selector 421 may output the maximum access address MADD or the captured address CADD as the selected address SADD. The address selector 421 may select the maximum access address MADD or the captured address CADD according to a predetermined order as described with reference to FIG. 9.

When the maximum access address MADD is the same as the previous selected address PADD and the captured address CADD is the same as the previous selected address PADD, the address selector 421 does not output the selected address SADD. In this example, the refresh address generator 423 does not generate the refresh address RADD and the refresh control signal RCS. In this case, the memory device 400 does not perform the row hammer refresh operation even when the memory device 400 receives the row hammer refresh command. This prevents unnecessary refresh of memory cells that have been recently refreshed.

Figure 14:
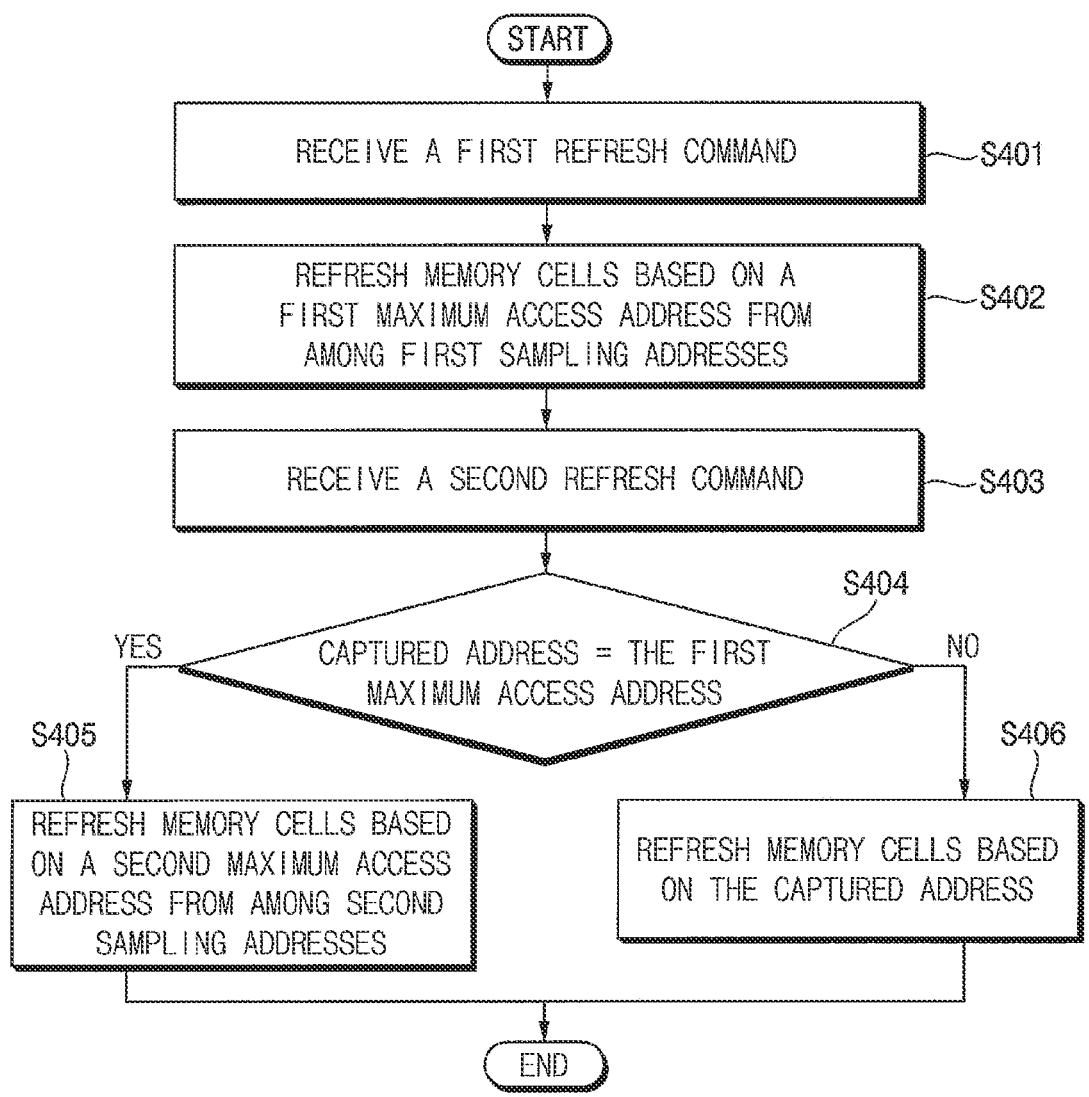
FIG. 14 is a flow chart illustrating an example operation of the memory device in FIG. 12 according to an exemplary embodiment of the inventive concept.

FIG. 14 is a flow chart illustrating an example operation of the memory device in FIG. 12 according to an exemplary embodiment of the inventive concept.

In particular, FIG. 14 illustrates an example of the memory device 400 performing a row hammer refresh operation based on the captured address CADD after the memory device 400 performs a row hammer refresh operation based on the maximum access address MADD.

Referring to FIGS. 12 and 14, in operation S401, the memory device 400 receives a first refresh command from a memory controller (for example, the memory controller

100 in FIG. 1). The first refresh command may correspond to a row hammer refresh command. When the memory device 400 receives N refresh commands from the memory controller 100, the memory device 400 may identify an N-th refresh command from among the N refresh commands as the first refresh command.

In operation S402, the memory device 400 performs a refresh operation based on a first maximum access address from among first sampling addresses, in response to the first (row hammer) refresh command. For example, the first sampling addresses correspond to addresses which are sampled before the memory device 400 receives the first refresh command. The memory device 400 may store the first maximum access address in the previous selected address register 422.

In operation S403, the memory device 400 receives a second refresh command from the memory controller 100. The second refresh command may correspond to a row hammer refresh command. When the memory device 400 receives N refresh commands from the memory controller 100 after receiving the first refresh command, the memory device 400 may identify an N-th refresh command from among the N refresh commands as the second refresh command. The memory device 400 may identify the second refresh command by referring to receiving timing of the first refresh command based on the refresh time interval tREF.

In operation S404, the memory device 400 determines whether the captured address CADD is the same as the first maximum access address. The captured address CADD may correspond to one of a plurality of addresses accessed during a time period between the first refresh command and the second refresh command. The memory device 400 may compare the first maximum access address corresponding to the previous selected address PADD with the captured address CADD.

When the captured address CADD is the same as the first maximum access address (YES in operation S404), in operation S405, the memory device 400 performs a refresh operation based on a second maximum access address from among second sampling addresses. For example, the second sampling addresses may include addresses sampled from addresses accessed during a time period between the first refresh command and the second refresh command. Since the refresh operation is performed based on the captured address CADD in a previous row hammer refresh operation, the memory device 400 may perform the row hammer refresh operation based on the second maximum access address.

When the captured address CADD is not the same as the first maximum access address (NO in operation S404), in operation S406, the memory device 400 performs a refresh operation based on the captured address CADD. Since the refresh operation is not performed based on the captured address CADD in a previous row hammer refresh operation, the memory device 400 400 may perform the row hammer refresh operation based on the captured address CADD.

In exemplary embodiments, the memory device 400 may select the second sampling addresses and the captured address CADD based on a time interval (i.e., a refresh time interval) between the first refresh command and the second refresh command as described with reference to FIGS. 7 through 11.

As described above, the memory device 400 may perform a row hammer refresh operation by selecting an address to be refreshed based on the previous selected address. In this case, the memory device 400 may prevent consecutive row hammer refresh operations based on the same address from being performed. Therefore, efficiency of the row hammer refresh operation may be enhanced.

Figure 15:
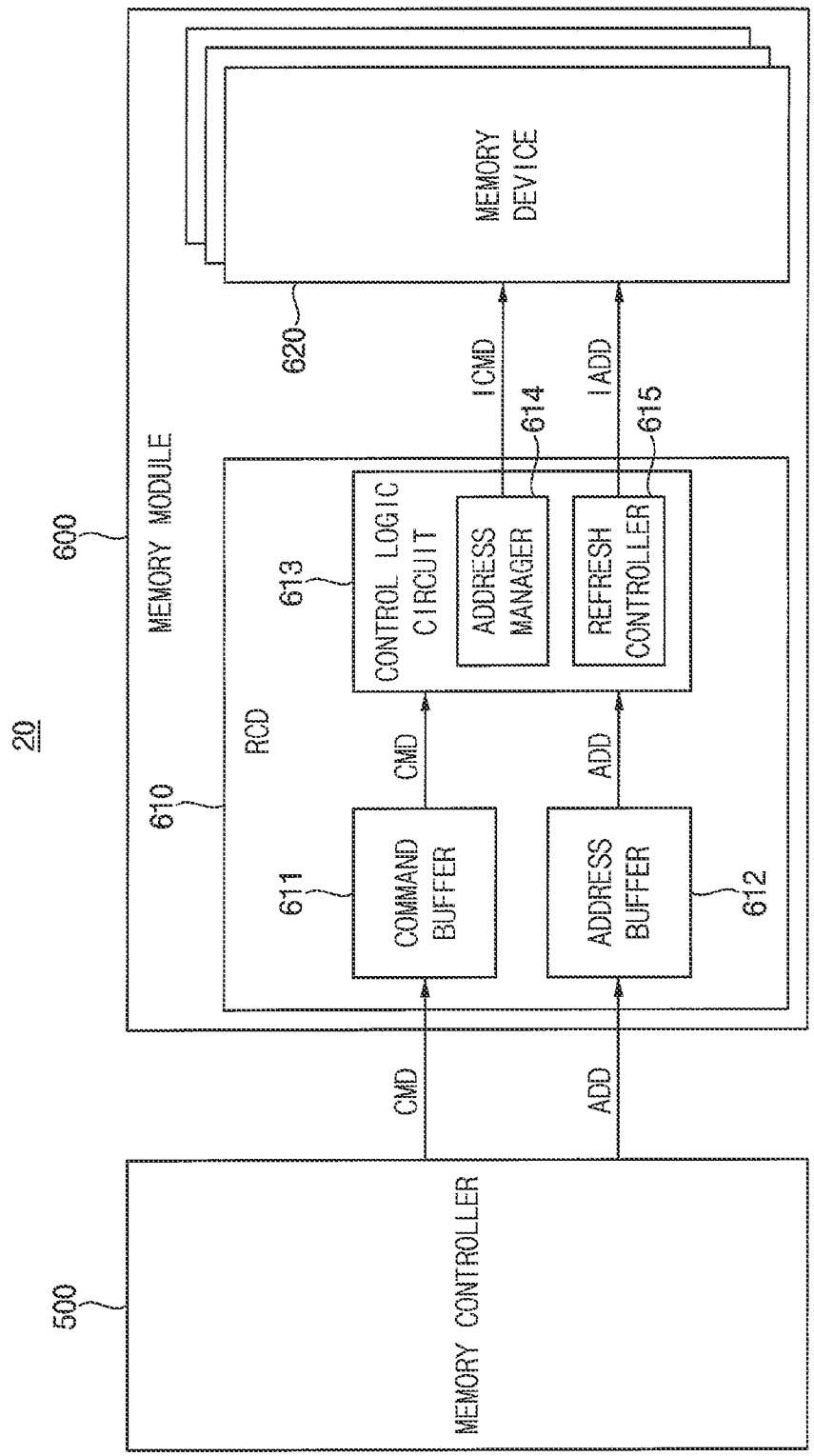
FIG. 15 is a block diagram illustrating another example of a memory system according to an exemplary embodiment of the inventive concept.

FIG. 15 is a block diagram illustrating an example of a memory system according to an exemplary embodiment of the inventive concept.

Referring to FIG. 15, a memory system 20 includes a memory controller 500 and a memory module 600.

For example, the memory system 20 may be one of various electronic devices such as a desktop computer, a laptop computer, a workstation, a server, a mobile device, etc. The memory controller 300 may correspond to the memory controller 100 in FIG. 1, and thus repeated description will be omitted.

The memory controller 500 may control the memory module 600. The memory controller 500 may transmit or issue a command CMD and an address ADD to the memory module for controlling the memory module 600.

The memory module 600 may operate based on the command CMD and the address ADD transmitted by the memory controller 500. The memory module 600 may store data transmitted from the memory controller 500 or may transmit data to the memory controller 500. The memory module 600 may include a register clock driver (RCD) 610 (e.g., a clock driving circuit) and one or more memory devices 620. The number of register clock drivers and the number of memory devices are not limited to the example shown in FIG. 15, and the memory module 600 may include one or more register clock drivers and one or more memory devices.

The register clock driver 610 may be connected to one or more memory devices 620 to drive the one or more memory devices 620. The register clock driver 610 may buffer the command CMD and the address ADD received from the memory controller 500, and may transmit the buffered command CMD and the buffered address ADD to the memory devices 620.

The register clock driver 610 may include a command buffer 611 that receives the command CMD from the memory controller 500 and transmits the command CMD to the memory devices 620 and an address buffer 612 that receives the address ADD from the memory controller 500 and transmits the address ADD to the memory devices 620. The register clock driver 610 may output the command CMD from the command buffer 611 and the address ADD from the address buffer 612 to the memory device 620 as an internal command ICMD and an internal address IADD.

The register clock driver 610 may be a buffer chip for transmitting the command CMD and the address ADD of the memory controller 500 to the memory devices 620. The memory devices 620 may receive the internal command ICMD and the internal address IADD from the memory controller 500 through the register clock driver 610, and may not receive the command CMD and the address ADD directly from the memory controller 500. The register clock driver 610 may improve signal integrity (SI) of the command CMD and the address ADD transmitted from the memory controller 500 to the memory devices 620.

The register clock driver 610 may further include a control logic circuit 613. The control logic circuit 613 may generate the internal command ICMD and the internal address IADD for controlling the memory devices 620 based on the command CMD from the command buffer 611 and the address ADD from the address buffer 612.

In an exemplary embodiment of the inventive concept, the control logic circuit 613 generates the internal command ICMD and the internal address IADD associated with a row hammer refresh operation in response to a row hammer refresh command received through the command buffer 611. For example, the internal command ICMD and the internal address IADD may correspond to the refresh control signal RCS and the refresh address RADD, respectively, which are described with reference to FIGS. 1 through 14.

The control logic circuit 613 may include an address manger 614 and a refresh controller 615. The address manger 614 may correspond to one of the address managers 220, 310 and 410 described with reference to FIGS. 1 through 14 and the refresh controller 615 may correspond to one of the refresh controllers 230, 320 and 420 described with reference to FIGS. 1 through 14. For example, the control logic circuit 613 may determine sampling addresses and a captured address based on a time interval between the refresh commands. The control logic circuit 613 may compare a maximum access address from among the sampling addresses and the captured address with a previous selected address and may perform a row hammer refresh operation based on an address selected based on a result of the comparison.

The memory devices 620 may operate based on the internal command ICMD and the internal address IADD received from the register clock driver 610. For example, the memory devices 620 may perform a refresh operation based on the internal command ICMD and the internal address IADD associated with a normal refresh operation and/or a row hammer refresh operation.

The memory devices 620 may employ the memory device 200 of FIG. 2. The memory devices 620 may include a memory cell array, a row decoder, a column decoder, a sense amplifier/write driver and a data I/O buffer. The memory devices 620 may refresh target memory cells in the memory cell array through the row hammer refresh operation. Therefore, the memory devices 620 may prevent data stored in the target memory cells from being lost due to a specified word-line being intensively accessed.

Figure 16:
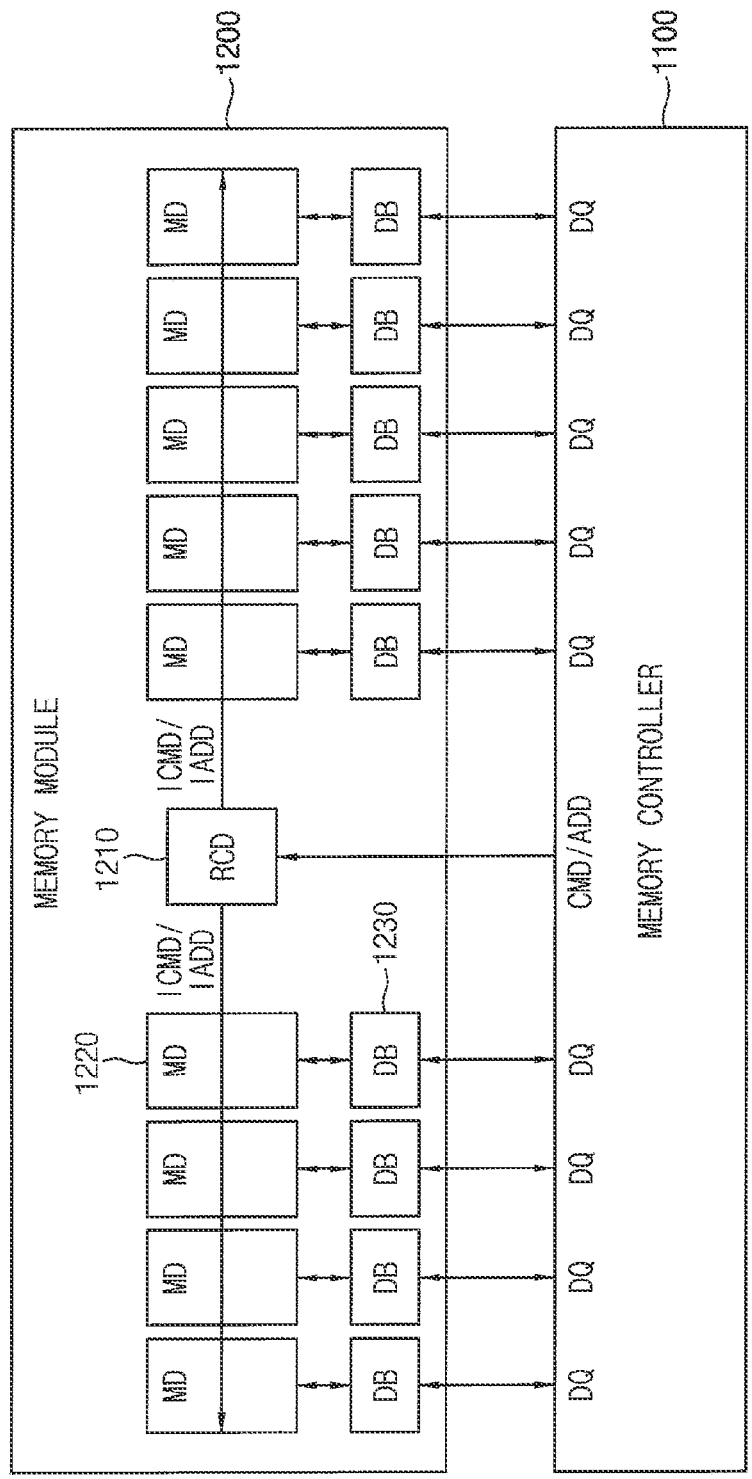
FIG. 16 is a block diagram illustrating another example of a memory system according to an exemplary embodiment of the inventive concept.

FIG. 16 is a block diagram illustrating an example of a memory system according to an exemplary embodiment of the inventive concept.

Referring to FIG. 16, a memory system 1000 includes a memory controller 1100 and a memory module 1200.

The memory module 1200 may include a register clock driver 1210, memory devices 1220, and data buffers 1230. The register clock driver 1210 may be implemented by using one of SoC, an application specific integrated circuit (ASIC) and a field-programmable gate array (FPGA).

The register clock driver 1210 may receive the command CMD and the address ADD from the memory controller 1100. The register clock driver 1210 may transmit internal command ICMD and an internal address IADD to the memory devices 1220 based on the command CMD and the address ADD. For example, the register clock driver 1210 may transmit the command CMD and the address ADD to the memory devices 1220 or generate the internal command ICMD and the internal address IADD based on the command CMD and the address ADD and transmit the internal command ICMD and the internal address IADD to the memory devices 1220.

For example, the register clock driver 1210 may correspond to the register clock driver 610 in FIG. 15. In this case, the register clock driver 1210 may generate the internal command ICMD and the internal address IADD associated with a row hammer refresh operation based on the command CMD and the address ADD.

Each of the memory devices 1220 may operate based on the internal command ICMD and the internal address IADD received from the register clock driver 1210.

Each of the memory devices 1220 may correspond to one of the memory devices 200, 300, 400 and 620 described with reference to FIGS. 1 through 15. When each of the memory devices 1220 corresponds to one of the memory devices 200, 300 and 400 described with reference to FIGS. 1 through 14, each of the memory devices 1220 may generate the refresh control signal RCS and the refresh address RADD associated with a row hammer refresh operation based on the internal command ICMD and the internal address IADD. Each of the memory devices 1220 may perform a row hammer refresh operation based on the refresh address RADD. When each of the memory devices 1220 corresponds to the memory device 620 in FIG. 15, each of the memory devices 1220 may perform a refresh operation based on the internal command ICMD and the internal address IADD.

The memory devices 1220 may share a path for receiving the internal command ICMD and the internal address IADD. In an exemplary embodiment, the memory devices disposed in a first side with respect to the register clock driver 1210 share a first path for receiving the internal command ICMD and the internal address IADD and the memory devices disposed in a second side with respect to the register clock driver 1210 may share a second path for receiving the internal command ICMD and the internal address IADD. For example, the memory devices 1220 disposed to the left of the register clock driver 1210 may be located in the first side and the memory devices 1220 disposed to the right of the register clock driver 1210 may be located in the second side.

Each of the memory devices 1220 may communicate data signals DQ with the memory controller 1100 through the data buffer 1230. Each of the memory devices 1220 may exchange data with the memory controller 1100 through the data buffer 1130. The memory devices 1220 may be accessed in parallel by the memory controller 1100. In FIG. 12, it is illustrated that the memory module 1200 includes nine memory devices 1220, but exemplary embodiments of the inventive concept are not limited thereto.

Figure 17:
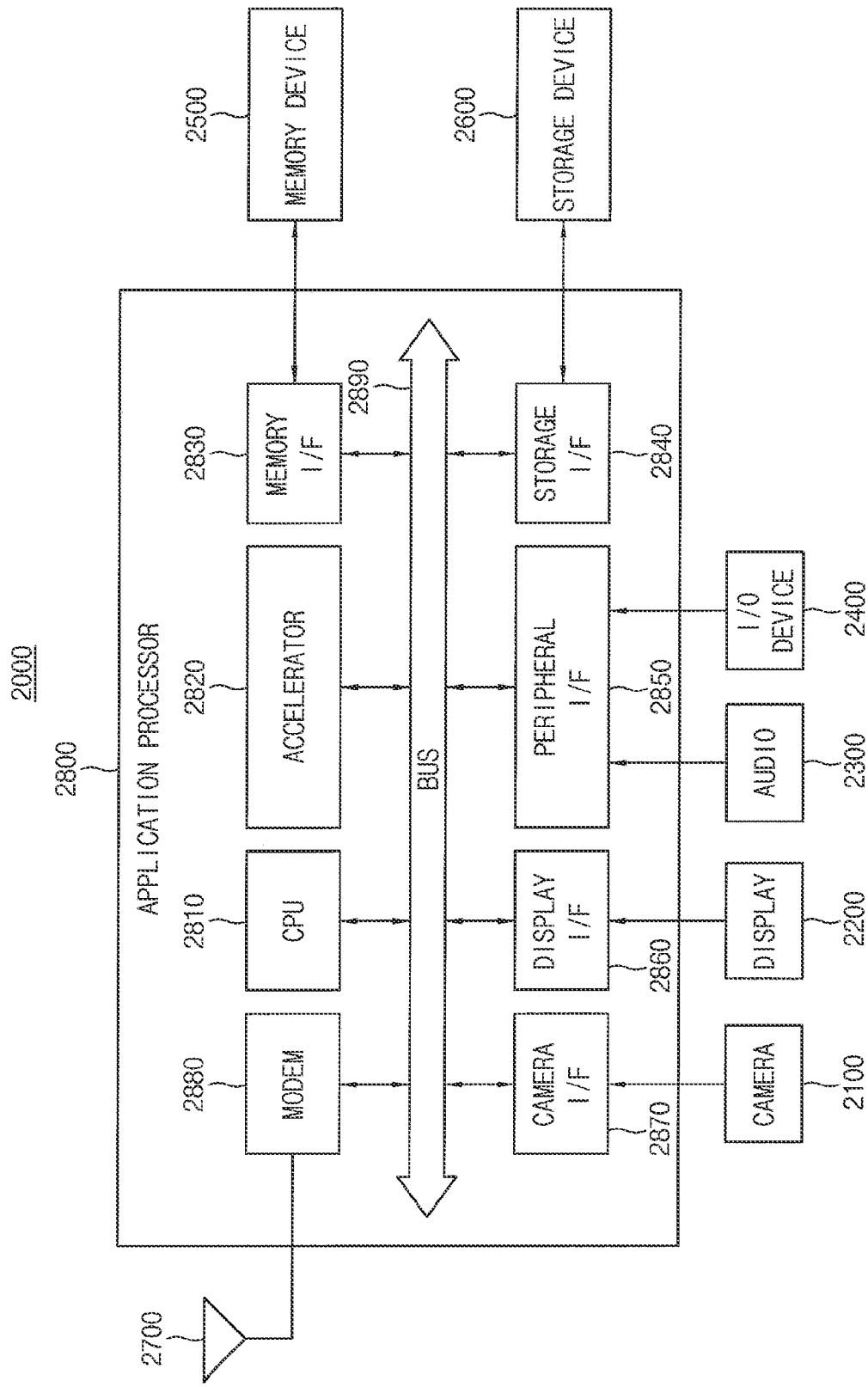
FIG. 17 is a block diagram illustrating an example of a mobile system according to an exemplary embodiment of the inventive concept.

FIG. 17 is a block diagram illustrating an example of a mobile system according to an exemplary embodiment of the inventive concept.

Referring to FIG. 17, a mobile system 2000 may include a camera 2100, a display 2200, an audio processor 2300, an I/O device 2400, a memory device 2500, a storage device 2600, an antenna 2700 and an application processor (AP) 2800.

The mobile system 2000 may be implemented with one of a laptop computer, a portable terminal, a smart phone, a tablet personal computer (PC), a wearable device, a healthcare device and internet of things (IoT). In addition, the mobile system 2000 may be implemented with a server or a PC.

The camera 2100 may capture an image or a video under control of a user. The camera 2100 may communicate with the AP 2800 through a camera interface (I/F) 2870.

The display 2200 may include, for example, a liquid crystal display (LCD), an organic light emitting diode (OLED) display, an active matrix (AM)-OLED, or a plasma display panel (PDP). The display 2200 may receive input signals through a user's touch and may be used as an input device of the mobile system 2000. The display 2200 may communicate with the AP 2800 through a display I/F 2860.

The audio processor 2300 may process audio data in contents transferred from the memory device 2500 or the storage device 2600. The audio processor 2300 may perform encoding/decoding or noise filtering on the audio data.

The I/O device 2400 may include various devices that provide a digital input and/or digital output such as a device to generate signal based on input of the user, a universal serial bus (USB), a digital camera, a secure digital (SD) card, a digital versatile disc (DVD) or a network adaptor. The audio processor 2300 and the I/O device 2400 may communicate with the AP 2800 through a peripheral I/F 2850.

The AP 2800 may control overall operation of the mobile system 200 through a central processing unit (CPU) 2810. The AP 2800 may control the display 2200 to display a portion of the contents stored in the storage device 2600. In addition, when a user's input is received through the I/O device 2400, the AP 2800 may perform control operation corresponding to the user's input. The AP 2800 may include a bus 2890 through which a modem 2880, the CPU 2810, an accelerator 2820, a memory I/F 2830, a storage I/F 2840, the peripheral I/F 2850, the display I/F 2860 and the camera I/F are connected to each other.

The AP 2800 may be implemented with an SoC to run an operating system (OS). The AP 2800, a memory device 2500 and the storage device 2600 may be implemented by using packages such as package on package (PoP), ball gridarrays (BGAs), chip scale packages (CSPs), system in package (SIP), multi-chip package(MCP), wafer-level fabricated package (WFP), and wafer-level processed stack package (WSP), etc.

The AP 2800 may further include an accelerator 2820. The accelerator 2820 may be a function block to perform a specified function. The accelerator 2820 may include a graphic processing unit (GPU) to process graphic data or a neural processing unit (NPU) to perform artificial neural network operation such as training and/or inference.

The AP 2800 may include a modem 2880 or a modem chip disposed in an outside of the AP 2800. The modem 2880 receives and/or transmits wireless data through an antenna 2700, modulates signals to be transmitted to the antenna 2700 and demodulates signals received from the antenna 2700.

The AP 2800 may include a memory I/F 2830 to communicate with the memory device 2500. The memory I/F 2830 may include a memory controller to control the memory device 2500 and the memory device 2500 may be directly connected to the AP 2800. The memory controller in the memory I/F 2830 may control the memory device 2500 by changing read/write instructions from the CPU 2810, the accelerator 2820 or the modem 2880 to commands for controlling the memory device 2500.

The AP 2800 may communicate with the memory device 2500 through a predefined interface protocol. The AP 2800 may communicate with the memory device 2500 through an interface protocol such as LPDDR4 or LPDDR5 conformed to JEDEC standards. The AP 2800 may communicate with the memory device 2500 through an interface protocol such as (high bandwidth) HBM, (hybrid memory cube) HMC or Wide I/O conformed to high bandwidth JEDEC standards.

For example, the memory device 2500 may be implemented with a DRAM device, but exemplary embodiments are the inventive concept are not limited thereto. The memory device 2500 may be implemented based on SRAM, PRAM, MRAM, FRAM, or a hybrid RAM.

The memory device 2500 may have a relatively smaller latency and bandwidth than the I/O device 2400 and the storage device 2600. The memory device 2500 may be initialized at a timing of power on of the mobile system 200 and an OS and application data are loaded into the memory device 2500. The memory device 2500 may be used for temporarily storing the OS and application data or a space for executing software.

In exemplary embodiments, the memory device 2500 may correspond to one of the memory devices 200, 300 and 400 described with reference to FIGS. 1 through 14. For example, the memory device 2500 may determine a sampling period and a capturing timing based on a time interval between the row hammer refresh commands from the memory controller in the AP 2800. The memory device 2500 compare a maximum access address from among the sampling addresses and the captured address with a previous selected address and may perform a row hammer refresh operation based on an address selected based on a result of the comparison.

The AP 2800 may include a storage I/F 2840 to communicate with the storage device 2600 and the storage device 2600 may be directly connected to the AP 2800. The storage device 2600 may be provided as a separate chip and the AP 2800 and the storage device 2600 may be fabricated into one package. The storage device 2600 may be implemented with a NAND flash memory, but exemplary embodiments of the inventive concept are not limited thereto.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A memory device comprising:
   a memory cell array including a plurality of memory cells coupled to a plurality of word-lines;
   an address manager configured to:
   perform sampling on access addresses provided from a memory controller to generate sampling addresses,
   determine a maximum access address based on selecting one of the sampling addresses that is most frequently accessed, and
   determine a capture address from among the access addresses, based on a capture time, the capture time being a time point that is randomly selected between refresh commands from the memory controller; and
   a refresh controller configured to refresh target memory cells from among the plurality of memory cells based on the maximum access address and the capture address.

2. The memory device of claim 1, wherein the address manager is configured to randomly determine a sampling period during which the address manager samples the access addresses and the capture time at which the address manager determines the capture address based on a time interval.

3. The memory device of claim 2, wherein the address manager is configured to randomly determine the sampling period based on comparison of a random binary code and a first binary code,
   wherein the address manager is configured to generate the random binary code based on an active command from the memory controller, and configured to generate the first binary code based on the time interval.

4. The memory device of claim 3, wherein the address manager is configured to determine the capture time based on a comparison of the random binary code and a second binary code which is generated based on the time interval, and
   wherein the first binary code is different from the second binary code.

5. The memory device of claim 4, wherein address manager is configured to determine a number of the first binary code and a number of the second binary code based on the time interval.

6. The memory device of claim 1, wherein the address manager is configured to sample a first number of the access addresses based on a first time interval between the refresh commands and is configured to sample a second number of the access addresses based on a second time interval between the refresh commands.

7. The memory device of claim 1, further comprising:
a mode register configured to store the time interval based on a mode register set command from the memory controller.

8. The memory device of claim 1, wherein the refresh controller is configured to generate a refresh address corresponding to the target memory cells based on one of the maximum access address and the capture address in response to the refresh commands and is configured to generate a refresh control signal for refreshing the target memory cells.

9. The memory device of claim 1, wherein the target memory cells are coupled to at least one second word-line adjacent to a first word-line corresponding to the maximum access address or the capture address.

10. The memory device of claim 1, wherein each of the refresh commands corresponds to a refresh command which is periodically provided from the memory controller.

11. The memory device of claim 1, wherein each of the plurality of memory cells includes a dynamic random access memory (DRAM) cell.

12. A memory device comprising:
a memory cell array including a plurality of memory cells coupled to a plurality of word-lines;
an address manager configured to perform a sampling on access addresses provided from a memory controller to generate sampling addresses determine a maximum access address as one of the sampling addresses that occurs most frequently, determine a certain number of active commands and select one of the access addresses that is accessed in response to receipt of the certain number of active commands as a capture address; and
a refresh controller configured to select one of the maximum access address and the capture address that does not match a previously selected address determined based on a previous refresh command, and configured to refresh target memory cells from among the plurality of memory cells based on the selected one address, in response to a refresh command from the memory controller.

13. The memory device of claim 12, wherein the refresh controller is configured to compare a maximum access address among the sampling addresses and the capture address with the previously selected address to select one of the maximum access address and the capture address.

14. The memory device of claim 13, wherein the address manager includes sampling registers configured to store the sampling addresses, and
wherein the address manager is configured to determine an address stored in a sampling register corresponding to a maximum counting value, from among the sampling registers corresponding to counting values, respectively, as the maximum access address.

15. The memory device of claim 14, wherein when the refresh controller performs a refresh operation based on the selected address,
the address manager is configured to reset a sampling register storing the selected address from among the sampling registers, and
the refresh controller is configured to store the selected address in a previously selected address register which stores the previous selected address.

16. The memory device of claim 12, wherein the refresh controller is configured to generate a refresh address corresponding to the target memory cells based on the selected address and is configured to generate a refresh control signal for refreshing the target memory cells.

17. The memory device of claim 16, wherein the target memory cells are coupled to at least one second word-line adjacent to a first word-line corresponding to a maximum access address among the sampling addresses or the capture address.

18. A method of operating a memory device including a plurality of memory cells coupled to a plurality of word-lines, the method comprising:
sampling access addresses provided from a memory controller to generate sampling addresses;
determining a maximum access address based on selecting one of the sampling addresses that is most frequently accessed;
determining a capture address, from among the access addresses, based on a capture time, the capture time being a time point that is randomly selected between refresh commands from the memory controller; and
refreshing target memory cells from among the plurality of memory cells based on the maximum access address and the capture address.

19. The method of claim 18, wherein sampling the access addresses and determining the capture address includes determining first sampling addresses and the capture address based on a time interval between refresh commands from the memory controller or a number of active commands provided from the memory controller during the time interval.

20. The method of claim 18, wherein refreshing the target memory cells comprises:
selecting one of the maximum access address and the capture address based on a previously selected address stored according to a previous refresh command; and
determining the target memory cells based on the selected address.

* * * * *